US008223058B2

(12) United States Patent
Kobayashi et al.

(10) Patent No.: US 8,223,058 B2
(45) Date of Patent: Jul. 17, 2012

(54) SWITCHED-CAPACITOR CIRCUIT HAVING A CAPACITOR ARRAY CIRCUIT, AND ANALOG-TO-DIGITAL CONVERTER USING SAID SWITCHED-CAPACITOR CIRCUIT

(75) Inventors: Shigeto Kobayashi, Gifu (JP); Atsushi Wada, Ogaki (JP); Toru Dan, Gifu (JP)

(73) Assignees: Semiconductor Components Industries, LLC, Phoenix, AZ (US); Sanyo Semiconductor Co., Ltd., Gunma (JP)

( * ) Notice: Subject to any disclaimer, the term of this patent is extended or adjusted under 35 U.S.C. 154(b) by 68 days.

(21) Appl. No.: 12/825,744

(22) Filed: Jun. 29, 2010

(65) Prior Publication Data
US 2010/0328119 A1 Dec. 30, 2010

(30) Foreign Application Priority Data

Jun. 30, 2009 (JP) ................................ 2009-155919

(51) Int. Cl.
*H03M 1/12* (2006.01)
(52) U.S. Cl. ........ 341/172; 341/118; 341/120; 341/155; 341/161; 341/162
(58) Field of Classification Search .................. 341/118, 341/120, 150, 155, 161, 172
See application file for complete search history.

(56) References Cited

U.S. PATENT DOCUMENTS

| | | | | |
|---|---|---|---|---|
| 6,127,958 A | * | 10/2000 | Chang et al. | 341/155 |
| 6,870,495 B1 | * | 3/2005 | Zadeh et al. | 341/161 |
| 6,914,550 B2 | * | 7/2005 | Cai | 341/155 |
| 7,057,544 B2 | * | 6/2006 | Lilamwala | 341/150 |
| 7,230,561 B2 | * | 6/2007 | Lee | 341/172 |
| 7,319,425 B2 | | 1/2008 | Fiorenza et al. | |
| 7,764,214 B2 | * | 7/2010 | Kobayashi et al. | 341/161 |
| 7,876,253 B2 | * | 1/2011 | Shimizu et al. | 341/158 |
| 7,902,898 B2 | * | 3/2011 | Tseng | 327/266 |
| 2007/0046510 A1 | * | 3/2007 | Zanchi et al. | 341/75 |
| 2007/0146192 A1 | * | 6/2007 | Sakata et al. | 341/155 |
| 2009/0009376 A1 | * | 1/2009 | Chamming's | 341/172 |
| 2009/0033534 A1 | * | 2/2009 | Kobayashi et al. | 341/150 |

* cited by examiner

*Primary Examiner* — Linh Nguyen
(74) *Attorney, Agent, or Firm* — McDermott Will & Emery LLP

(57) ABSTRACT

A capacitor array circuit receives a plurality of input signals, generate a single output signal by combining the plurality of input signals, and output the single output signal. A comparator receives the output signal of the capacitor array circuit. A current source, which is disposed between a predetermined fixed voltage source and an output terminal of the switched-capacitor circuit, supplies the current to the output terminal until the output signal of the comparator changes. A plurality of input capacitors in the capacitor array circuit receives a plurality of input signals in parallel with each other. At least one additional regulating capacitor in the capacitor array circuit store the charge to compensate for an offset component caused by the delay in the comparator. The respective output terminals of the plurality of input capacitors and the at least one additional regulating capacitor are combined into one.

8 Claims, 24 Drawing Sheets

500b

SWITCHED-CAPACITOR CIRCUIT HAVING A CAPACITOR ARRAY CIRCUIT, AND ANALOG-TO-DIGITAL CONVERTER USING SAID SWITCHED-CAPACITOR CIRCUIT

CROSS-REFERENCE TO RELATED APPLICATIONS

This application is based upon and claims the benefit of priority from the prior Japanese Patent Application No. 2009-155919, filed on Jun. 30, 2009, the entire contents of which are incorporated herein by reference.

BACKGROUND OF THE INVENTION

1. Field of the Invention

The present invention relates to a switched-capacitor provided with a capacitor array circuit, and an analog-to-digital converter.

2. Description of the Related Art

Recent years have seen a number of propositions for a type of amplifier circuit in which an output voltage is determined by controlling the time for sending a current to the output terminal from a constant current source by the output of a comparator (hereinafter referred to as "comparator-based amplifier circuit" as appropriate).

SUMMARY OF THE INVENTION

The comparator-based amplifier circuit is advantageous in having the capacity to reduce power consumption in contrast to the general type of amplifier circuit using virtual ground. However, a problem with the comparator-based amplifier circuit is the delay of the comparator that can directly affect its output voltage as an offset component.

A switched-capacitor circuit according to one embodiment of the present invention comprises: a capacitor array circuit configured to receive a plurality of input signals, generate a single output signal by combining the plurality of input signals, and output the single output signal; a comparator configured to receive the output signal of said capacitor array circuit; and a current source, disposed between a predetermined fixed voltage source and an output terminal of the switched-capacitor circuit, configured to supply a current to the output terminal until an output signal of the comparator changes. The capacitor array circuit includes: a plurality of input capacitors for receiving a plurality of input signals in parallel with each other; and a regulating capacitor for storing a charge to compensate for an offset component caused by a delay in said comparator. The respective output terminals of the plurality of input capacitors and the regulating capacitor are combined into one.

Another embodiment of the present invention relates to an analog-to-digital (A-D) converter. The A-D converter according to another embodiment of the present invention is an A-D converter for converting input analog signals into digital signals from a higher-order bit toward a lower-order bit through a plurality of times of conversion processings, and the A-D converter comprises: a sub-A-D converter circuit configured to convert a first analog signal into a digital signal of a predetermined number of bits; a digital-to-analog (D-A) converter circuit configured to convert the digital signal, which has been converted by the sub-A-D converter circuit, into a second analog signal; a subtraction circuit configured to subtract the second analog signal from the first analog signal or the first analog signal amplified by a predetermined gain; and an amplifier circuit configured to amplify a difference signal, between the first analog signal and the second analog signal, which is a result of subtraction done by the subtraction circuit, and generate an analog residual signal to be processed by a subsequent conversion processing. The D-A converter, the subtraction circuit and the amplifier circuit are configured by the above-described switched-capacitor circuit. The switched-capacitor circuit may receive the aforementioned input signals as the first analog signal and may receive a reference voltage as the digital signal which has been converted by the sub-A-D converter circuit.

BRIEF DESCRIPTION OF THE DRAWINGS

Embodiments will now be described by way of examples only, with reference to the accompanying drawings which are meant to be exemplary, not limiting, and wherein like elements are numbered alike in several Figures in which:

FIG. 9A illustrates an example of output voltage in a positive-side comparator-based amplifier circuit, and FIG. 9B illustrates an example of output voltage in a negative-side comparator-based amplifier circuit;

FIG. 17A illustrates an example of output voltage in a positive-side comparator-based amplifier circuit that constitutes a differential amplifier circuit, and FIG. 17B illustrates an example of output voltage in a negative-side comparator-based amplifier circuit that constitutes the differential amplifier circuit;

DETAILED DESCRIPTION OF THE INVENTION

The invention will now be described by reference to the preferred embodiments. This does not intend to limit the scope of the present invention, but to exemplify the invention.

Hereinbelow, a switched-capacitor circuit 300 of a differential configuration according to preferred embodiments of the present invention is explained. It should be noted that the switched-capacitor circuit 300 according to the preferred embodiments of the present invention is not limited to one of a differential configuration, but may be one of a single configuration.

Figure 1:
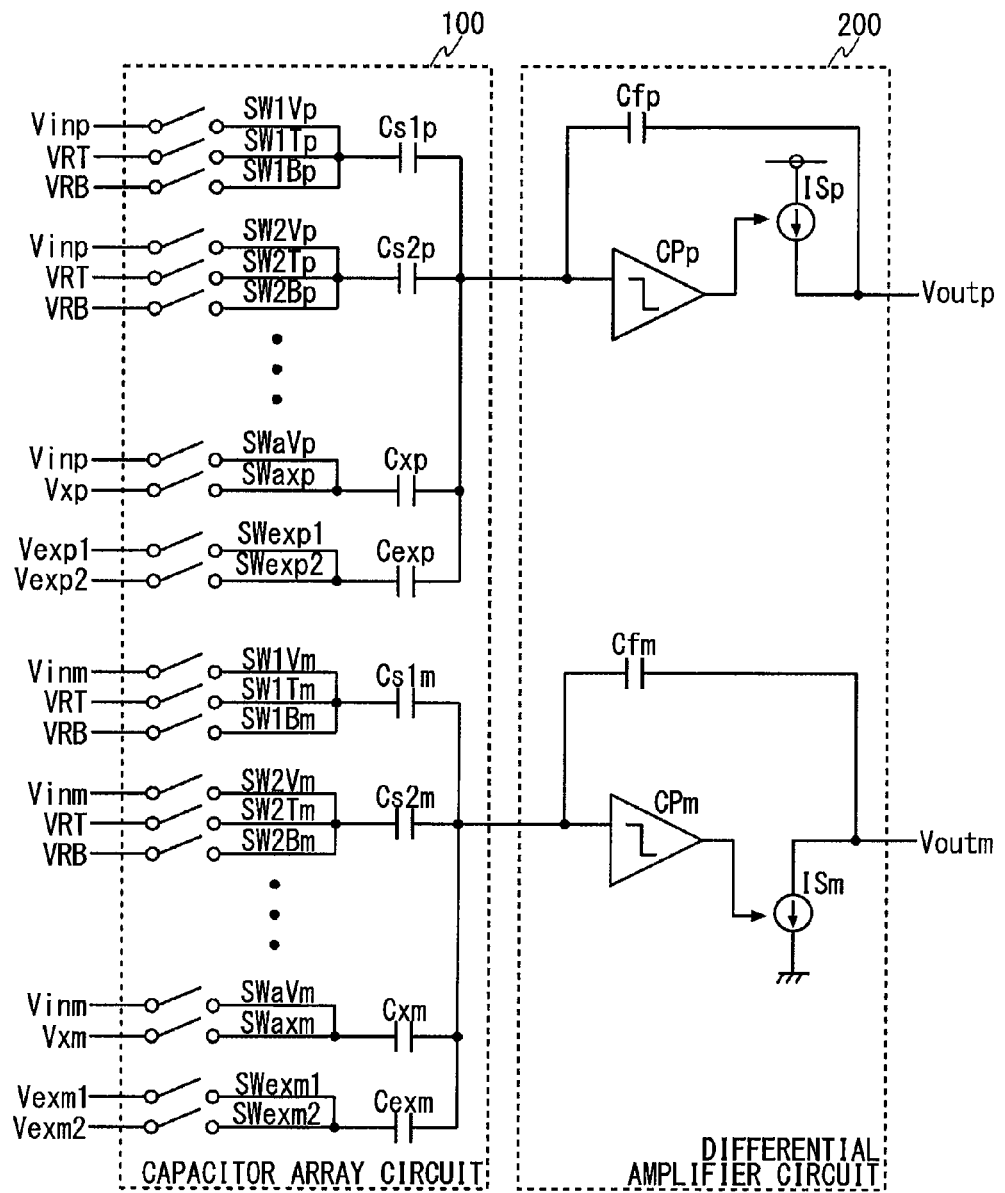
FIG. 1 is a configuration diagram of a switched-capacitor circuit incorporating a capacitor array circuit according to a first embodiment of the present invention.

FIG. 1 is a configuration diagram of a switched-capacitor circuit 300 incorporating a capacitor array circuit 100 according to a first embodiment of the present invention. The switched-capacitor circuit 300 includes a capacitor array circuit 100 and a differential amplifier circuit 200.

The capacitor array circuit 100 receives a plurality of differential input signals and generates a single differential output signal by combining them. More specifically, the capacitor array circuit 100 generates a single differential output signal by performing a capacitive coupling of a plurality of differential input signals inputted from a plurality of differential input channels and outputs the thus generated single differential output signal from a single differential output channel.

The capacitor array circuit 100, which is of a differential configuration, is provided with a positive-side capacitor array and a negative-side capacitor array. The positive-side capacitor array receives a plurality of positive-side input signals of a plurality of differential input signals and generates a positive-side output signal of a differential output signal by combining them. The negative-side capacitor array receives a plurality of negative-side input signals of a plurality of differential input signals and generates a negative-side output signal of a differential output signal by combining them.

The positive-side capacitor array includes a plurality of positive-side input capacitors ($Cs1p$, $Cs2p$, ...), a positive-side regulating capacitor $Cxp$, and a positive-side additional regulating capacitor $Cexp$. The respective output terminals of the plurality of positive-side input capacitors ($Cs1p$, $Cs2p$, ...), the positive-side regulating capacitor $Cxp$, and the positive-side additional regulating capacitor $Cexp$ are combined into one.

The negative-side capacitor array includes a plurality of negative-side input capacitors ($Cs1m$, $Cs2m$, ...), a negative-side regulating capacitor $Cxm$, and a negative-side additional regulating capacitor $Cexm$. The respective output terminals of the plurality of negative-side input capacitors ($Cs1m$, $Cs2m$, ...), the negative-side regulating capacitor $Cxm$, and the negative-side additional regulating capacitor $Cexm$ are combined into one.

Connected in parallel to an input terminal of the positive-side input capacitor $Cs1p$ are a positive-side input analog signal switch $SW1Vp$, a high-potential-side reference voltage switch $SW1Tp$, and a low-potential-side reference voltage switch $SW1Bp$. The positive-side input analog signal switch $SW1Vp$ is a switch for switching between inputting a positive-side input analog signal $Vinp$ to the input capacitor $Cs1p$ or not. The high-potential-side reference voltage switch $SW1Tp$ is a switch for switching between inputting a high-potential-side reference voltage $VRT$ to the input capacitor $Cs1p$ or not. The low-potential-side reference voltage switch $SW1Bp$ is a switch for switching between inputting a low-potential-side reference voltage $VRB$ to the input capacitor $Cs1p$ or not.

All the input capacitors ($Cs1p$, $Cs2p$, ...), constituting the positive-side capacitor array are of the same configuration as described above. Also, all the input capacitors ($Cs1m$, $Cs2m$, ...) constituting the negative-side capacitor array are of the same configuration as described above except that a negative-side input analog signal $Vinm$ is inputted to the negative-side input analog signal switch $SW1Vm$.

Connected in parallel to the input terminal of the positive-side regulating capacitor $Cxp$ are a positive-side input analog signal switch $SWaVp$ and a positive-side regulating voltage switch $SWaxp$. The positive-side input analog signal switch $SWaVp$ is a switch for switching between inputting a positive-side input analog signal $Vinp$ to the positive-side regulating capacitor $Cxp$ or not. The positive-side regulating voltage switch $SWaxp$ is a switch for switching between inputting a positive-side regulating voltage $Vxp$ to the positive-side regulating capacitor $Cxp$ or not.

The negative-side regulating capacitor $Cxm$ is also of the same configuration as described above except that a negative-side input analog signal $Vinm$ is inputted to the negative-side input analog signal switch $SWaVm$ and that a negative-side regulating voltage $Vxm$ is applied to the negative-side regulating voltage switch $SWaxm$.

Connected in parallel to the input terminal of the positive-side additional regulating capacitor $Cexp$ are a positive-side first additional regulating voltage switch $SWexp1$ and a positive-side second additional regulating voltage switch $SWexp2$. The positive-side first additional regulating voltage switch $SWexp1$ is a switch for switching between inputting a positive-side first additional regulating voltage $Vexp1$ to the positive-side additional regulating capacitor $Cexp$ or not. The positive-side second additional regulating voltage switch $SWexp2$ is a switch for switching between inputting a positive-side second additional regulating voltage $Vexp2$ to the positive-side additional regulating capacitor $Cexp$ or not.

The negative-side additional regulating capacitor $Cexm$ is also of the same configuration as described above except that a negative-side first additional regulating voltage $Vexm1$ is inputted to the negative-side first additional regulating voltage switch $SWexm1$ and that a negative-side second additional regulating voltage Vexm2 is inputted to the negative-side second additional regulating voltage switch SWexm2.

It should be noted here that the positive-side regulating voltage Vxp and negative-side regulating voltage Vxm as described above may be the voltages used to compensate for the variance of their respective common-mode voltages while the differential value of the differential output signal of the differential amplifier circuit provided anterior or posterior to the capacitor array circuit 100 is kept constant. Also, the positive-side first additional regulating voltage Vexp1, the positive-side second additional regulating voltage Vexp2, the negative-side first additional regulating voltage Vexm1, and the negative-side second additional regulating voltage Vexm2 as described above may be the voltages for compensating for the offset components caused by the delay in a positive-side comparator CPp and negative-side comparator CPm, respectively, to be described later. A detailed description of the compensation for the offset components will be given later.

In the mode where any of the high-potential-reference voltage VRT and the low-potential-side reference voltage VRB is inputted to each of the positive-side input capacitors (Cs1p, Cs2p, . . . ) and the negative-side input capacitors (Cs1m, Cs2m, . . . ), the capacitor array circuit 100 functions as a digital-to-analog converter that converts digital values into analog values.

In this mode, the above-mentioned plurality of differential input signals are a plurality of binary signals (the high-potential-side reference voltage VRT and the low-potential-side reference voltage VRB here) representing a single digital value. The above-mentioned differential output signal is an analog signal representing a single analog value, which is a result of capacitive coupling of those binary signals. The plurality of binary signals are ones represented in thermometer code.

The thermometer code is a notational system in which a number is given by increasing the number "1" monotonically. More specifically, "1" is added to the next higher digit as the value grows larger. For example, "2" in decimal notation is "11" in thermometer code and "10" in binary code. "3" in decimal notation is "111" in thermometer code and "11" in binary code. And "4" in decimal notation is "1111" in thermometer code and "100" in binary code.

Therefore, the thermometer code requires the same number of bits as the maximum value in a decimal numerical range to be handled. For example, 7 bits in thermometer code are required to represent 3-bit binary data (0 to 7 in decimal notation), and 15 bits to represent 4-bit binary data (0 to 15 in decimal notation).

Generally, the capacitor array circuit is designed and fabricated in units of multipliers of 2; that is, it is often provided with 4, 8, 16, or 32 capacitors. In such a case, 7 capacitors are required when a 3-bit thermometer code is to be handled in binary code. Also, 15 capacitors are required when a 4-bit thermometer code is to be handled in binary code. Thus, when, for instance, a capacitor array circuit provided with 8 or 16 capacitors is used, one capacitor remains unused. In the present embodiment, therefore, the remaining capacitor is used as a regulating capacitor Cx. It is to be noted that the numbers of capacitors mentioned above are those of single configuration, and hence double the numbers are required for differential configuration.

Note also that the additional regulating capacitor Cex is a capacitor added to a capacitor array provided with a multiplier of 2 of capacitors. As will be discussed later, addition of this capacitor makes it possible to add the offset component of Cexp(Vexp1−Vexp2)−Cexm(Vexm1−Vexm2) to the differential output voltage of the differential amplifier circuit 200.

The differential amplifier circuit 200 is constituted by a pseudo differential amplifier circuit combining a positive-side amplifier circuit and a negative-side amplifier circuit. The positive-side amplifier circuit and the negative-side amplifier circuit are each constituted by a comparator-based amplifier circuit.

The positive-side amplifier circuit includes a positive-side comparator CPp, a positive-side feedback capacitor Cfp, and a positive-side current source ISp. The positive-side comparator CPp receives a positive-side output signal of the capacitor array circuit 100. The positive-side feedback capacitor Cfp is disposed on a path connecting a positive-side input terminal and a positive-side output terminal of the differential amplifier circuit 200. The positive-side current source ISp, which is disposed between a predetermined first fixed voltage source (supply voltage here) and the positive-side output terminal of the differential amplifier circuit 200, supplies a current to the output terminal until the output signal of the positive-side comparator CPp changes.

The negative-side amplifier circuit includes a negative-side comparator CPm, a negative-side feedback capacitor Cfm, and a negative-side current source ISm. The negative-side comparator CPm receives a negative-side output signal of the capacitor array circuit 100. The negative-side feedback capacitor Cfm is disposed on a path connecting a negative-side input terminal and a negative-side output terminal of the differential amplifier circuit 200. The negative-side current source ISm, which is disposed between a predetermined second fixed voltage source (ground voltage here) and the negative-side output terminal of the differential amplifier circuit 200, supplies a current to the output terminal until the output signal of the negative-side comparator CPm changes.

Figure 2:
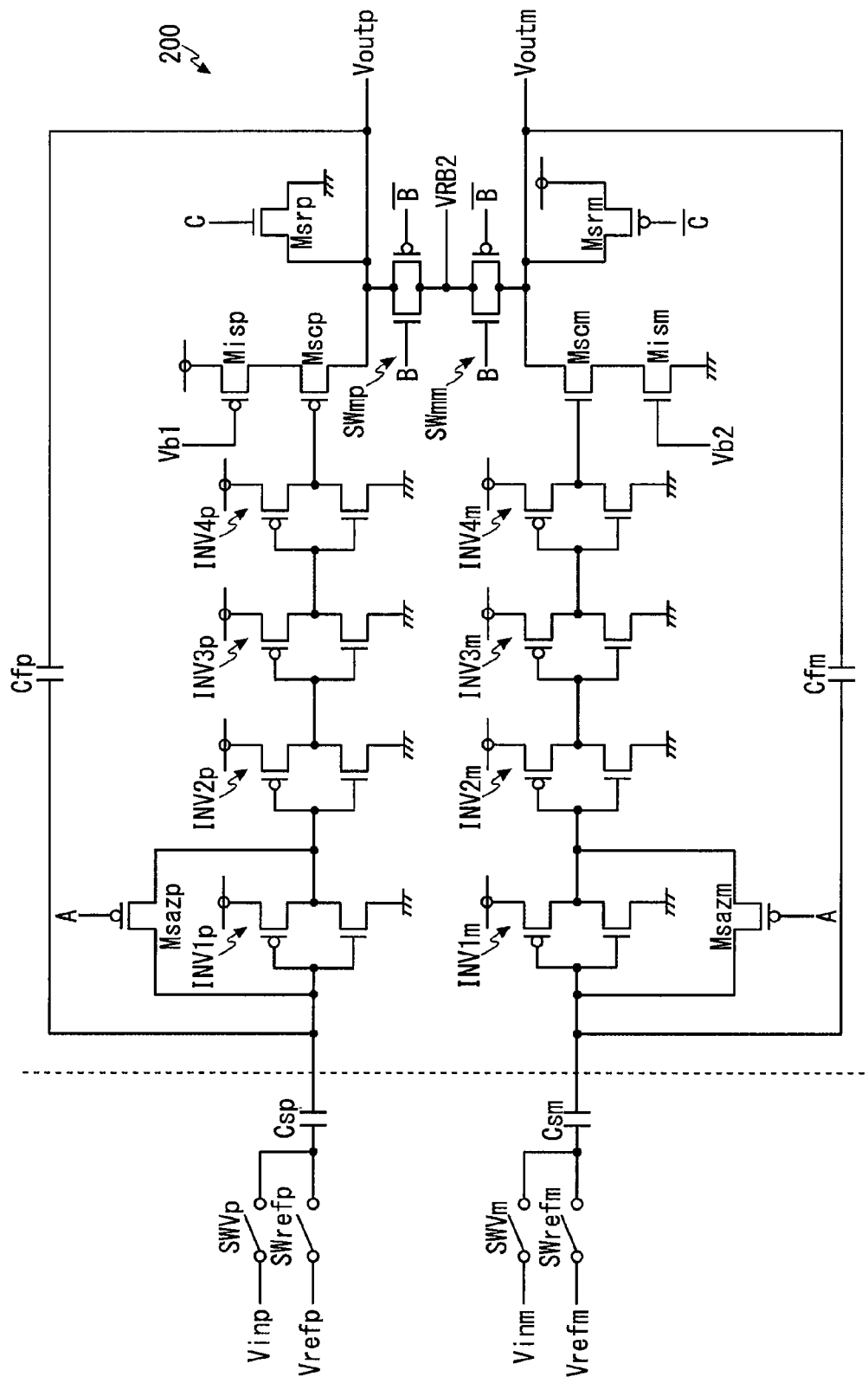
FIG. 2 illustrates an example of the internal configuration of a differential amplifier circuit.

FIG. 2 illustrates an example of the internal configuration of the differential amplifier circuit 200. To simplify the Figure, a plurality of positive-side input capacitors (Cs1p, Csp, etc.), the positive-side regulating capacitor Cxp and the positive-side additional regulating capacitor Cexp are generically expressed by a single positive-side input capacitor Csp. Similarly, a plurality of positive-side analog signal switches (SW1Vp, SW2Vp, . . . , and SWaVp) and the first positive-side additional regulating voltage switch SWexp1 are generically expressed by a single positive-side input analog signal switch SWVp. Similarly, a plurality of positive-side high-potential-side reference switches (SW1Tp, SW2Tp, etc.), a plurality of positive-side low-potential-side reference switches (SW1Bp, SW2Bp, etc.), the positive-side regulating voltage switch SWaxp, and the positive-side second additional regulating voltage switch SWexp2 are generically expressed by a single positive-side reference voltage switch SWrefp. It is to be noted here that a positive-side input analog signal Vin shown in FIG. 2 generically expresses the voltages inputted to the positive-side input capacitors Csp at the time of sampling and this positive-side analog signal Vin is a concept also including the positive-side first additional regulating voltage Vexp1. This assumption also applies to the negative-side ones.

A positive-side reference voltage Vrefp inputted to the positive-side reference voltage switch SWrefp corresponds to the positive-side output signal after a plurality of binary signals representing the aforementioned digital values have been converted into an analog signal expressing a single analog value. The same applies to the negative-side output signal.

The positive-side comparator CPp of FIG. 1, which is a chopper-type comparator, includes a positive-side first inverter INV1p, a positive-side second inverter INV2p, a positive-side third inverter INV3p, a positive-side fourth inverter INV4p, and an auto-zero switch Msazp. The positive-side first inverter INV1p, the positive-side second inverter INV2p, the positive-side third inverter INV3p and the positive-side fourth inverter INV4p are cascade-connected to each other.

The positive-side first invert IV1p is a commonly-used inverter of a push-pull configuration including a P-channel transistor and an N-channel transistor. More specifically, a source terminal of the P-channel transistor is connected to the first fixed voltage source (supply voltage here), a gate terminal thereof is connected to an input terminal of the first inverter INV1p, and a drain terminal thereof is connected to a drain terminal of the N-channel transistor. A source terminal of the N-channel transistor is connected to the second fixed voltage source (ground voltage here), a gate terminal thereof is connected to the input terminal of the first inverter INV1p, and the drain terminal thereof is connected to the drain terminal of the P-channel transistor.

The configurations of the positive-side second inverter INV2p, the positive-side third inverter INV3p and the positive-side fourth inverter INV4p are the same as the configuration of the positive-side first inverter INV1p.

The positive-side auto-zero switch Msazp is connected on a path connecting the input terminal of the positive first inverter INV1p and the output terminal thereof. The positive-side auto-zero switch Msazp is configured by a P-channel transistor in this example. Signal A described later is inputted to a gate terminal of the P-channel transistor. Turning on the P-channel transistor short-circuits the input terminal and the output terminal of the positive-side first inverter INV1p.

With the above-described configuration, when the input analog signal Vinp is sampled in the positive-side input capacitor Csp, an output terminal voltage of the positive-side first inverter INV1p can be applied to the opposite side of a sampling-side terminal of the input capacitor Csp. The output terminal voltage prior to the start of amplification becomes an intermediate voltage between the supply voltage and the ground voltage. However, there are cases where an offset component is contained in the output terminal voltage due to, for example, a variation in devices of the P-channel transistor and the N-channel transistor in the inverter.

If the positive-side input capacitor Csp samples the positive-side input analog signal Vinp by taking the effect of the offset component into consideration, the offset component will be automatically cancelled in the processing carried out by the positive-side first inverter INV1p subsequent to the sampling. The configuration of the negative-side comparator CPm of FIG. 1 is the same as that of the above-described positive-side comparator CPp except that the voltage handled is a negative voltage, and therefore the repeated description thereof is omitted here. In the present patent specification, the state where the input terminal of the positive first inverter INV1p and the output terminal of thereof are electrically connected to each other is called an auto-zero state. The same applies to the negative-side first inverter INV1m as well.

The positive-side current source ISp of FIG. 1 includes a positive-side constant current source Misp and a positive-side charge switch Mscp. The positive-side constant current source Misp and the positive-side charge switch Mscp are connected in series between the first fixed voltage source (supply voltage here) and the positive-side output terminal of the differential amplifier circuit 200.

The positive-side constant current source Misp and the positive-side charge switch Mscp are each configured by a P-channel transistor. A source terminal of the P-channel transistor constituting the positive-side constant current source Misp is connected to the first fixed voltage source (supply voltage here). A drain terminal thereof is connected to the positive-side charge switch Mscp. A predetermined first bias voltage Vb1 is applied to a gate thereof.

A source terminal of the P-channel transistor constituting the positive-side charge switch Mscp is connected to the positive-side constant current source Misp. A drain terminal thereof is connected to the positive-side output terminal of the differential amplifier circuit 200. A gate thereof is connected to an output terminal of the positive-side comparator CPp.

The negative-side current source ISm of FIG. 1 includes a negative-side constant current source Mism and a negative-side charge switch Mscm. The negative-side constant current source Mism and the negative-side charge switch Mscm are connected in series between the second fixed voltage source (ground voltage here) and the negative-side output terminal of the differential amplifier circuit 200.

The negative-side constant current source Mism and the negative-side charge switch Mscm are each configured by an N-channel transistor. A source terminal of the N-channel transistor constituting the negative-side constant current source Mism is connected to the second fixed voltage source (supply voltage here). A drain terminal thereof is connected to the negative-side charge switch Mscm. A predetermined second bias voltage Vb2 is applied to a gate thereof.

A source terminal of the N-channel transistor constituting the negative-side charge switch Mscm is connected to the negative-side constant current source Mism. A drain terminal thereof is connected to the negative-side output terminal of the differential amplifier circuit 200. A gate thereof is connected to an output terminal of the negative-side comparator CPm.

A positive-side intermediate reference potential switch SWmp is connected between the positive-side output terminal of the differential amplifier circuit 200 and an intermediate reference voltage VRB2. The positive-side intermediate reference potential switch SWmp is configured by a complementary switch in which an N-channel transistor and a P-channel transistor are combined. Signal B described later is inputted to a gate of the N-channel transistor, whereas inverted signal $\overline{B}$, which is the inverted signal of signal B, is inputted to a gate of the P-channel transistor. Note that the intermediate reference voltage VRB2 is set to an intermediate voltage between the aforementioned high-potential-side reference voltage VRT and the aforementioned low-potential-side reference voltage VRB.

Similarly, a negative-side intermediate reference potential switch SWmm is connected between a negative-side output terminal of the differential amplifier circuit 200 and the intermediate reference voltage VRB2. The negative-side intermediate reference potential switch SWmm is also configured by a complementary switch in which an N-channel transistor and a P-channel transistor are combined. Signal B described later is inputted to a gate of the N-channel transistor, whereas inverted signal $\overline{B}$ described later, which is the inverted signal of signal B, is inputted to a gate of the P-channel transistor.

Also, a positive-side reset switch Msrp is connected between the positive-side output terminal of the differential amplifier circuit 200 and the second fixed voltage source (ground voltage here). The positive-side reset switch Msrp is configured by an N-channel transistor. Signal C described later is inputted to a gate of the N-channel transistor.

Similarly, a negative-side reset switch Msrm is connected between the negative-side output terminal of the differential amplifier circuit 200 and the first fixed voltage source (supply voltage here). The negative-side reset switch Msrm is configured by a P-channel transistor. Inverted signal $\overline{C}$ described later, which is the inverted signal of signal C, is inputted to a gate of the P-channel transistor.

Figure 3:
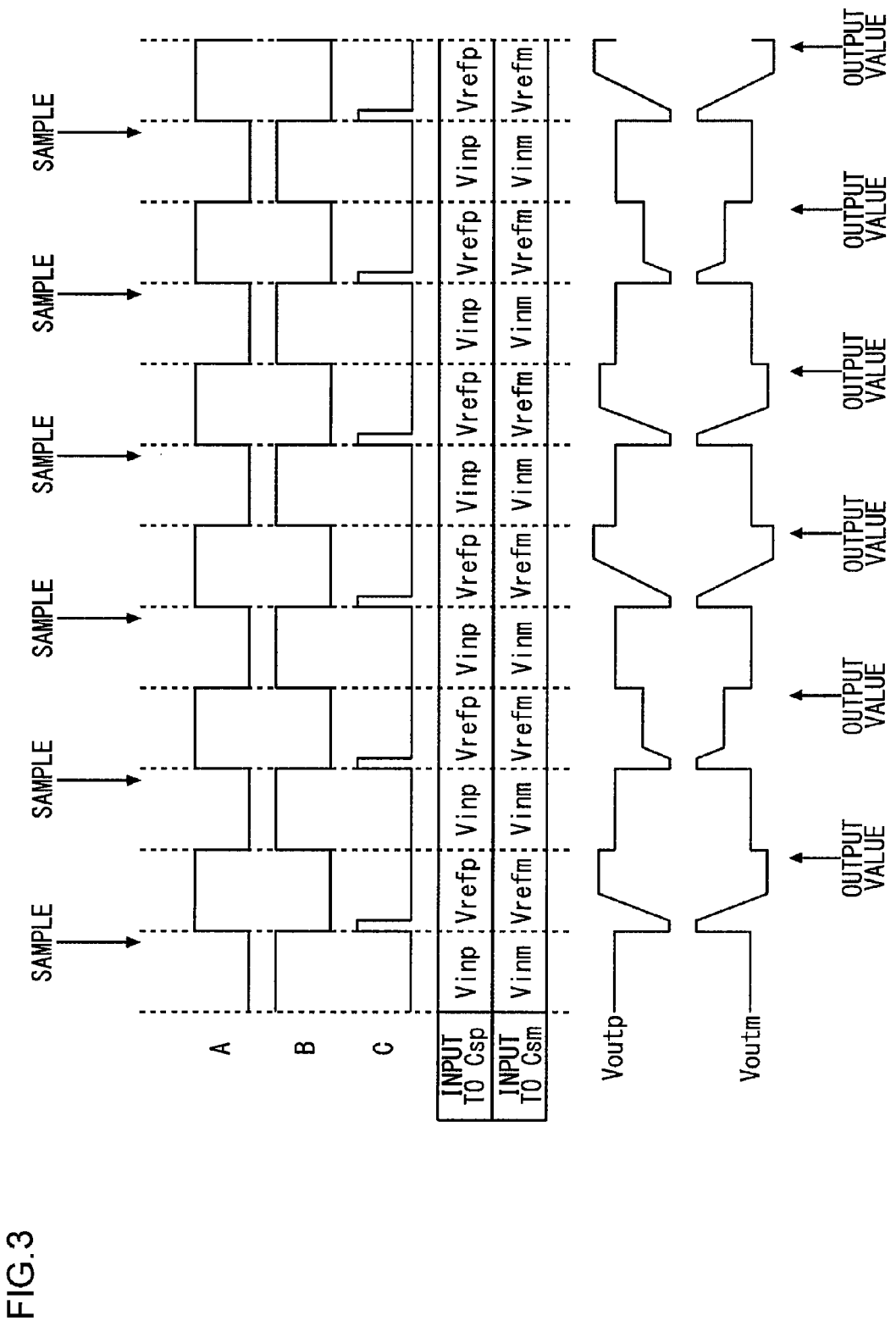
FIG. 3 is a timing chart showing an operation of a differential amplifier circuit as shown in FIG. 2.

FIG. 3 is a timing chart showing an operation of the differential amplifier circuit 200 as shown in FIG. 2. As shown in FIG. 3, signal A and signal B are clock signals whose duty ratio is 1/2. Signal A and signal B have opposite phases. Signal C is a clock signal whose duty ratio is very small.

In a first period when signal A is low, signal B is high, and signal C is low, the switches are so controlled that the positive-side input analog signal switch SWVp and the negative-side input analog signal switch SWVm are on and that the positive-side reference voltage switch SWrefp and the negative-side reference voltage switch SWrefm are off. That is, during the first period, the positive-side input analog signal Vinp is inputted to the positive-side input capacitor Csp, and the negative-side input analog signal Vinm is inputted to the negative-side input capacitor Csm.

During the first period, signal A is low, and therefore the positive-side auto-zero switch Msazp and the negative-side auto-zero switch Msazm are controlled to be on. That is, the switched-capacitor circuit 300 is so controlled as to be in an auto-zero state. Also, since signal B is high and signal C is low, the switches are so controlled that the positive-side intermediate reference potential switch SWmp and the negative-side intermediate reference potential switch SWmm are on and that the positive-side reset switch Msrp and the negative-side reset switch Msrm are off. Accordingly, the positive-side output terminal voltage and the negative-side output terminal voltage of the differential amplifier circuit 200 are both equal to the intermediate reference voltage VRB2.

Next, let us see a second period when signal A is high, signal B is low, and signal C is high. During the second period, the switches are so controlled that the positive-side input analog signal switch SWVp and the negative-side input analog signal switch SWVm are off and that the positive-side reference voltage switch SWrefp and the negative-side reference voltage switch SWrefm are on. That is, during the second period, a positive-side reference voltage Vrefp is inputted to the positive-side input capacitor Csp, and a negative-side reference voltage Vrefm is inputted to the negative-side input capacitor Csm. Note that the value immediately before the switching of these switches is the sampled value of the input analog signal Vin.

During the second period, signal A is high, and therefore the positive-side auto-zero switch Msazp and the negative-side auto-zero switch Msazm are controlled to be off, and the auto-zero state of the switched-capacitor circuit 300 is canceled. Also, since signal B is low and signal C is high, the switches are so controlled that the positive-side intermediate reference potential switch SWmp and the negative-side intermediate reference potential switch SWmm are off and that the positive-side reset switch Msrp and the negative-side reset switch Msrm are on. Accordingly, the positive-side output terminal voltage of the differential amplifier circuit 200 becomes the ground voltage, and the negative-side output terminal voltage thereof becomes the supply voltage.

Next, a transition is made to a third period when signal A is high, signal B is low, and signal C is low. During the third period, the controlled state of the switches is maintained such that the positive-side input analog signal switch SWVp and the negative-side input analog signal switch SWVm are off and that the positive-side reference voltage switch SWrefp and the negative-side reference voltage switch SWrefm are on.

During the third period, since signal B and signal C are low, the switches are so controlled that the positive-side intermediate reference potential switch SWmp and the negative-side intermediate reference potential switch SWmm are off and that the positive-side reset switch Msrp and the negative-side reset switch Msrm are also off. Accordingly, the positive-side output terminal voltage of the differential amplifier circuit 200 becomes a voltage corresponding to the electric charge supplied from the positive-side constant current source Misp, and the negative-side output terminal voltage thereof becomes a voltage corresponding to the electric charge supplied from the negative-side constant current source Mism.

The positive-side output terminal voltage and negative-side output terminal voltage of the differential amplifier circuit 200 immediately before the transition from the third period to the first period become the differential output value.

As shown in FIG. 3, the waveform of the positive-side output terminal voltage of the differential amplifier circuit 200 and that of the negative-side output terminal voltage thereof vary, depending on the value of the input analog signal Vin sampled by the input capacitors Cs and the value of the reference voltage Vref inputted to the input capacitors Cs during an amplification period of the differential amplifier circuit 200. In the above sentence and hereinafter, the positive-side input capacitor Csp and the negative-side input capacitor Csm are generically referred to simply as "input capacitor Cs" or "input capacitors Cs". Also, in the above sentence and hereinafter, the positive-side input analog signal Vinp and the negative-side input analog signal Vinm are generically referred to simply as "input analog signal Vin". Also, in the above sentence and hereinafter, the positive-side reference voltage Vrefp and the negative-side reference voltage Vrefm are generically referred to simply as "reference voltage Vref".

Figure 4:
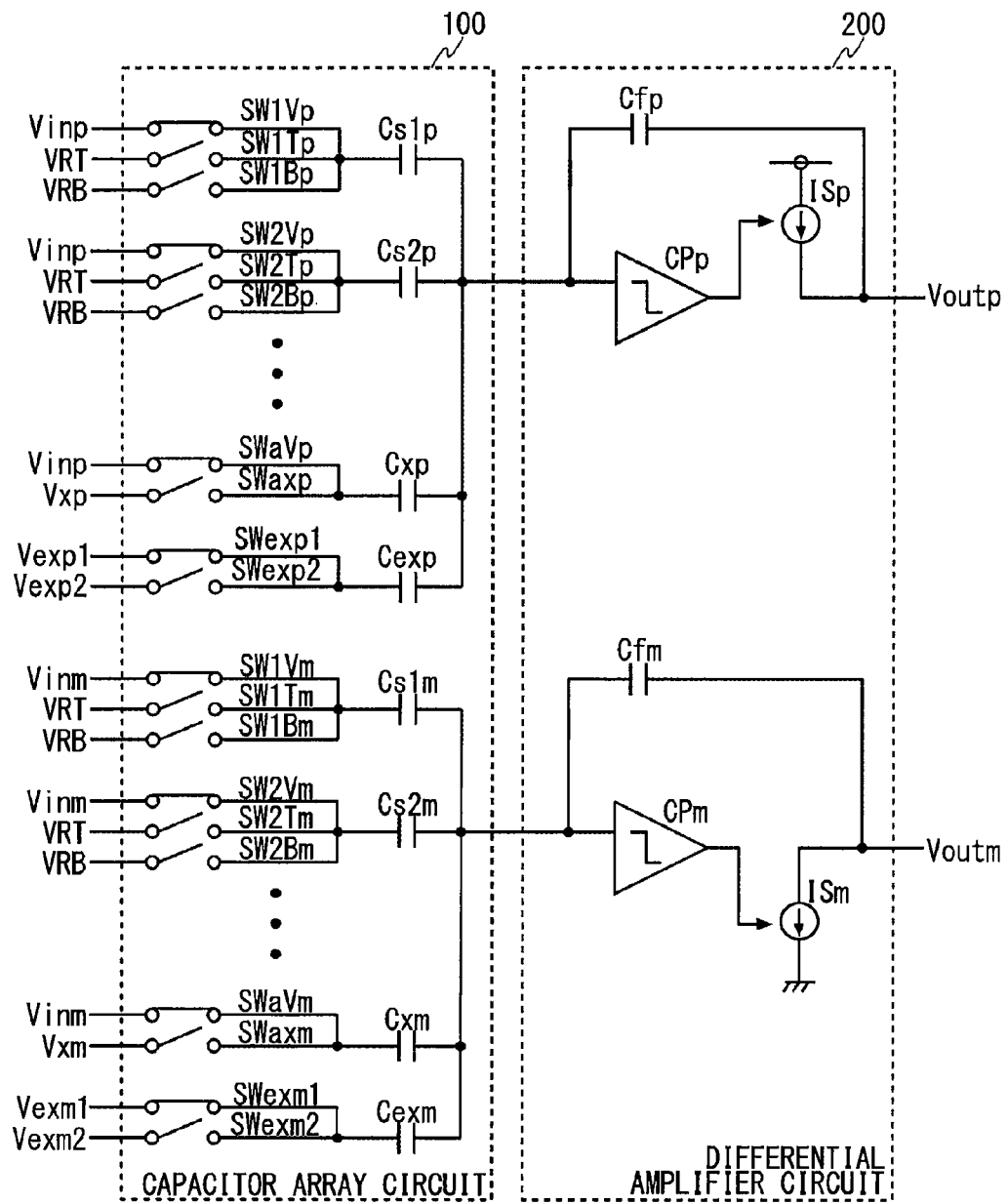
FIG. 4 illustrates how a switched-capacitor circuit according to a first embodiment behaves in an auto-zero state.

Next, a description will be given of overall operations of the switched-capacitor circuit 300 according to the first embodiment. FIG. 4 illustrates how the switched-capacitor circuit 300 according to the first embodiment behaves in an auto-zero state (phase). In this state (phase), the positive-side analog signal Vinp is inputted to all of the positive-side input capacitors ($Cs1p$, $Cs2p$, ...) and the positive-side regulating capacitor Cxp, whereas the negative-side analog signal Vinm is inputted to all of the negative-side input capacitors ($Cs1m$, $Cs2m$, ...) and the negative-side regulating capacitor Cxm. Also, the positive-side first additional regulating voltage Vexp1 is inputted to the positive-side additional regulating capacitor Cexp, whereas the negative-side first additional regulating voltage Vexm1 is inputted to the negative-side additional regulating capacitor Cexm.

Figure 5:
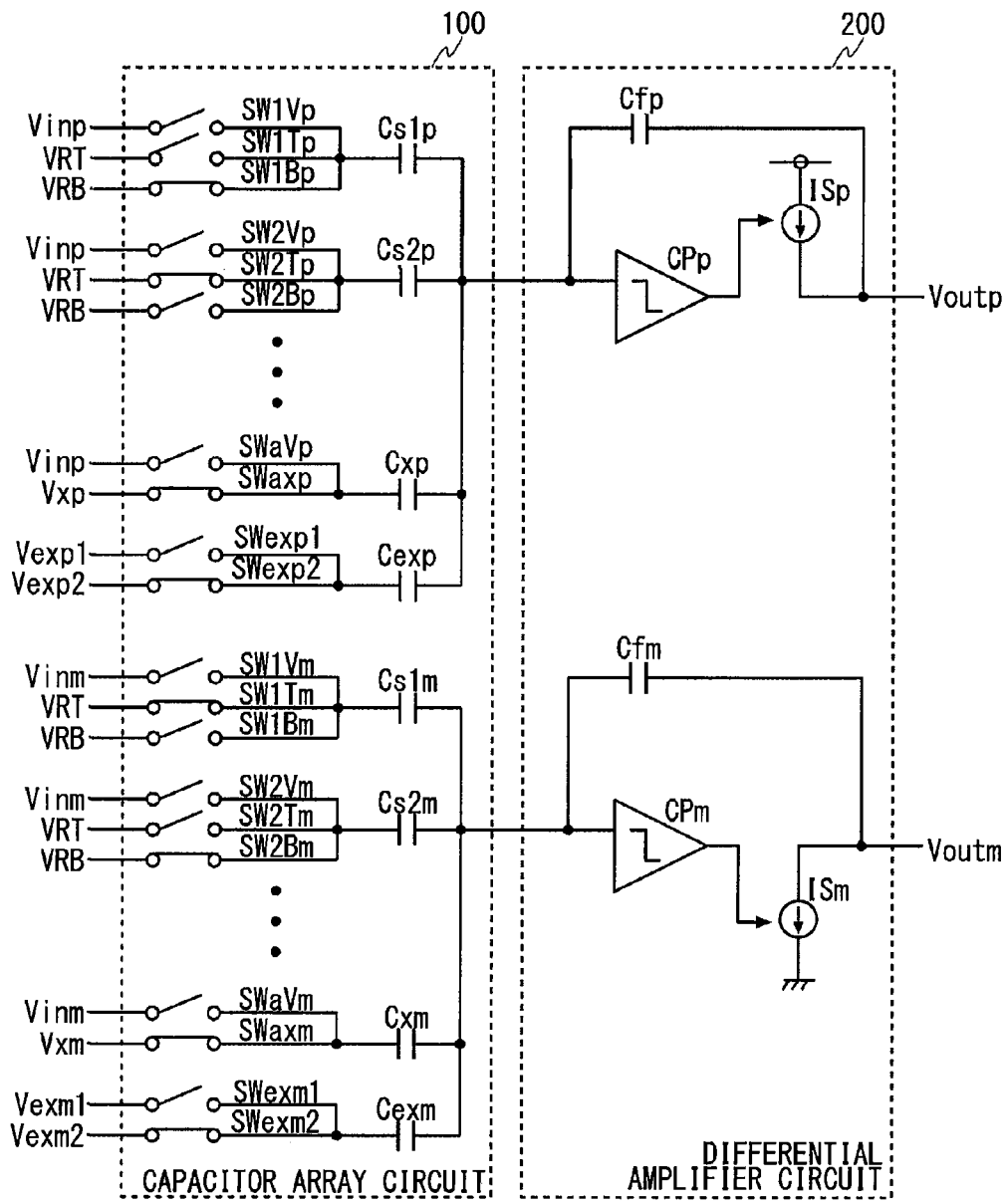
FIG. 5 illustrates how a switched-capacitor circuit according to a first embodiment behaves in an amplified state.

FIG. 5 illustrates how the switched-capacitor circuit 300 according to the first embodiment behaves in an amplified state. In this state, either the high-potential-side reference voltage VRT or the low-potential-side reference voltage VRB is inputted to the positive-side input capacitors ($Cs1p$, $Cs2p$, ...), respectively, whereas the positive-side regulating voltage Vxp is inputted to the positive-side regulating capacitor Cxp. Also, either the high-potential-side reference voltage VRT or the low-potential-side reference voltage VRB is inputted to the negative-side input capacitors ($Cs1m$, $Cs2m$, ...), respectively, whereas the negative-side regulating voltage Vxm is inputted to the negative-side regulating capacitor Cxm. Also, the positive-side second additional regulating voltage Vexp2 is inputted to the positive-side additional regulating capacitor Cexp, and the negative-side second additional regulating voltage Vexm2 is inputted to the negative-side additional regulating capacitor Cexm2.

A detailed description is given hereinbelow of an exemplary case where there are provided fifteen positive-side input capacitors ($Cs1p$, $Cs2p$, ...), a single positive-side regulating capacitor Cxp, a single positive-side additional regulating capacitor Cexp, fifteen negative-side input capacitors ($Cs1m$, $Cs2m$, ...), a single negative-side regulating capacitor Cxm, and a single negative-side additional regulating capacitor Cexm. It is assumed that the capacitance value of each of these capacitors is the same.

In the auto-zero state shown in FIG. 4, an electric charge Q stored in all of the capacitors including the positive-side feedback capacitor Cfp and the negative-side feedback capacitor Cfm is defined by the following Equations (1) and (2). Equation (1) indicates a positive-side electric charge Qp, and Equation (2) indicates a negative-side electric charge Qm.

Since the capacitance values of the positive-side input capacitors (Cs1$p$, Cs2$p$, . . . ), the positive-side regulating capacitor Cxp, the negative-side input capacitors (Cs1$m$, Cs2$m$, . . . ) and the negative-side regulating capacitor Cxm are all the same, the capacitance value of each one of them will be denoted by Cs to simplify the equations. Also, since the capacitance value of the positive-side feedback capacitor Cfp and the capacitance value of the negative-side feedback capacitor Cfm are equal to each other, each of them will be denoted by Cf to simplify the equations.

$$Qp = Cs \cdot 16 \cdot (Vinp - Vazp) + Cf \cdot (VRB2 - Vazp) + Cexp \cdot (Vexp1 - Vazp) \quad \text{Eq. (1)}$$

$$Qm = Cs \cdot 16 \cdot (Vinm - Vazm) + Cf \cdot (VRB2 - Vazm) + Cexm \cdot (Vexm1 - Vazm) \quad \text{Eq. (2)}$$

In Equation (1), Vazp indicates an input terminal voltage and an output terminal voltage of the positive-side first inverter INV1$p$ in an auto-zero state. In other words, it may be rephrased that Vazp is an output inverted voltage, of the positive-side first inverter INV1$p$, which is added with an offset component of the positive-side first inverter INV1$p$. In Equation (2), Vazm indicates an input terminal voltage and an output terminal voltage of the negative-side first inverter INV1$m$ in an auto-zero state. In other words, it may be rephrased that Vazm is an output inverted voltage, of the negative-side first inverter INV1$m$, which is added with an offset component of the negative-side first inverter INV1$m$.

Next, in an amplified state as shown in FIG. 5, the following Equation (3) defines the electric charge Qp stored in all of the positive-side capacitors at the time when the input terminal voltage of the positive-side comparator CPp has reached the positive-side auto-zero voltage Vazp. Also, in the amplified state as shown in FIG. 5, the following Equation (4) defines the electric charge Qm stored in all of the negative-side capacitors at the time when the input terminal voltage of the negative-side comparator CPm has reached the negative-side auto-zero voltage Vazm.

$$Qp = Cs \cdot \{n \cdot VRT + (15-n) \cdot VRB + Vxp - 16 \cdot Vazp\} + Cf \cdot (Voutp - Vazp) + Cexp \cdot (Vexp2 - Vazp) \quad \text{Eq. (3)}$$

$$Qm = Cs \cdot \{n - VRB + (15-n) \cdot VRT + Vxm - 16 \cdot Vazm\} + Cf \cdot (Voutm - Vazm) + Cexm \cdot (Vexm2 - Vazm) \quad \text{Eq. (4)}$$

In Equation (3), n indicates the number of input capacitors Csp to which the high-potential-side reference voltage VRT is inputted in the positive-side input capacitors Csp.

As described above, immediately after the start of amplification by the differential amplifier circuit 200, the positive-side output terminal of the differential amplifier circuit 200 and the negative-side output terminal thereof are reset to the ground voltage and the supply voltage, respectively. As a result, the positive-side input terminal voltage of the differential amplifier circuit 200 drops from the positive-side auto-zero voltage Vazp toward the ground voltage, whereas the negative-side input terminal voltage of the differential amplifier circuit 200 rises from the negative-side auto-zero voltage Vazm toward the supply voltage.

Then, the positive-side input terminal voltage of the differential amplifier circuit 200 rises toward the positive-side auto-zero voltage Vazp, and the negative input terminal voltage thereof drops toward the negative-side auto-zero voltage Vazm. As the positive-side input terminal voltage thereof reaches the positive-side auto-zero voltage Vazp, the positive-side first inverter INV1$p$ is inverted. Then, as the positive-side auto-zero switch Msazp turns off, the charging to the positive-side output terminal of the differential amplifier circuit 200 is stopped. On the other hand, as the negative-side input terminal voltage of the differential amplifier circuit 200 reaches the negative-side auto-zero voltage Vazm, the negative-side first inverter INV1$m$ is inverted. Then, as the negative-sided auto-zero switch Msazm turns off, the charging to the negative-side output terminal of the differential amplifier circuit 200 is stopped. The above Equation (3) and Equation (4) indicate the charges stored in all of the capacitors in this state.

The law of conservation of electric charges holds in the auto-zero state and in a state in which the input terminal voltage of the comparator CP has reached the auto-zero voltage. Thus, the output voltage, which is (Voutp−Voutm) of the differential amplifier circuit 200, is defined, by the following Equation (5), using the above-described Equations (1) to (4).

$$Voutp - Voutm = (Cs/Cf) \cdot \{16 \cdot (Vinp - Vinm) + VRT \cdot (15 - 2n) + VRB \cdot (2n - 15) + (Vxp - Vxm)\} + (Cexp/Cf) \cdot (Vexp1 - Vexp2) - (Cexm/Cf) \cdot (Vexm1 - Vexm2) \quad \text{Eq. (5)}$$

With the above-described processing, the switched-capacitor circuit 300 can amplify the difference between the input analog signal Vin and the reference voltage Vref. In other words, during an amplification period (phase), not a predetermined fixed voltage (e.g., ground voltage) but the reference voltage is applied to the positive-side input capacitors (Cs1$p$, Cs2$p$, . . . ) and the negative-side input capacitors (Cs1$m$, Cs2$m$, . . . ), so that the reference voltage Vref can be subtracted from the input analog signal Vin.

At the time, using the four kinds of voltages, a voltage with which to compensate for its offset component can be added to the differential output voltage of the differential amplifier circuit 200, wherein the four kinds of voltages are the positive-side first additional regulating voltage Vexp1, the positive-side second additional regulating voltage Vexp2, the negative-side first additional regulating voltage Vexm1 and the negative-side second additional regulating voltage Vexm2. The voltage used to compensate for the offset component can be generated by adjusting the value(s) of at least one of these four kinds of voltages. Also, the voltage used to compensate for the offset component can be generated by adjusting the capacitance value(s) of at least one of the positive-side additional regulating capacitor Cexp and the negative-side additional regulating capacitor Cexm.

Also, using the positive-side regulating voltage Vxp and the negative-side regulating voltage Vxm, voltages used to compensate for the variance of common-mode voltage can be added to the differential output voltage of the differentials amplifier circuit 200. Note that the voltage used to compensate for the aforementioned offset component and/or the voltage used to compensate for the variance of the aforementioned common-mode voltage can be generated by any combination of six kinds of voltages. Here, the six kinds of voltages are the positive-side regulating voltage Vxp, the negative-side regulating voltage Vxm, the positive-side first additional regulating voltage Vexp1, the positive-side second additional regulating voltage Vexp2, the negative-side first additional regulating voltage Vexm1 and the negative-side second additional regulating voltage Vexm2. Thus the offset component and the common-mode variance can be simultaneously compensated.

Figure 6:
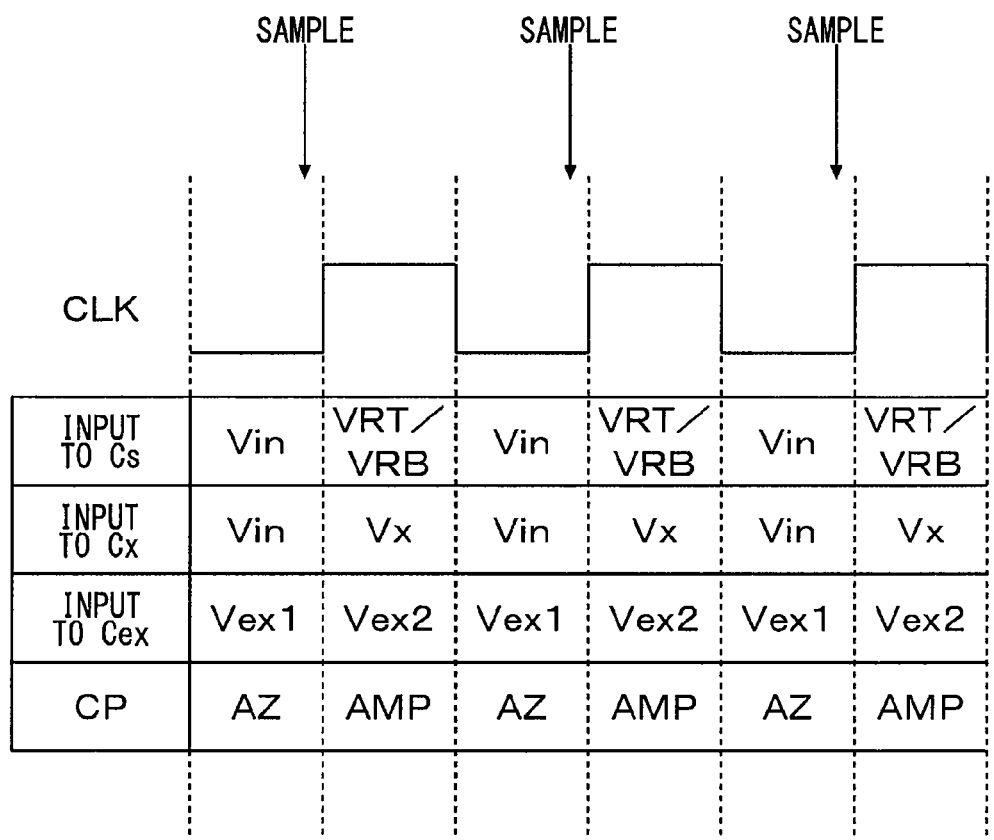
FIG. 6 is a timing chart showing an operation of a switched-capacitor circuit according to a first embodiment.

FIG. 6 is a timing chart showing an operation of the switched-capacitor circuit 300 according to the first embodiment. During auto-zero periods of the positive-side comparator CPp and the negative-side comparator CPm, the positive-side input analog signal Vinp is inputted to the positive-side input capacitors (Cs1p, Cs2p, . . . ) and the positive-side regulating capacitor Cxp; the negative-side input analog signal Vinm is inputted to the negative-side input capacitors (Cs1m, Cs2m, . . . ) and the negative-side regulating capacitor Cxm. Also, the positive-side first additional regulating voltage Vexp1 is inputted to the positive-side additional regulating capacitor Cexp, whereas the negative-side first additional regulating voltage Vexm1 is inputted to the negative-side additional regulating capacitor Cexm.

The positive-side input analog signal Vinp and the negative-side input analog signal Vinm at the end of the auto-zero periods become sampled values. In amplification periods of the positive-side comparator CPp and the negative-side comparator CPm, either the high-potential-side reference voltage VRT or low-potential-side reference voltage VRB is inputted to the positive-side input capacitors (Cs1p, Cs2p, . . . ) and the negative-side input capacitors (Cs1m, Cs2m, . . . ), respectively. Also, the positive-side regulating voltage Vxp is inputted to the positive-side regulating capacitor Cxp, whereas the negative-side regulating voltage Vxm is inputted to the negative-side regulating capacitor Cxm. Also, the positive-side second additional regulating voltage Vexp2 is inputted to the positive-side additional regulating capacitor Cexp, whereas the negative-side second additional regulating voltage Vexm2 is inputted to the negative-side additional regulating capacitor Cexm.

Figure 7:
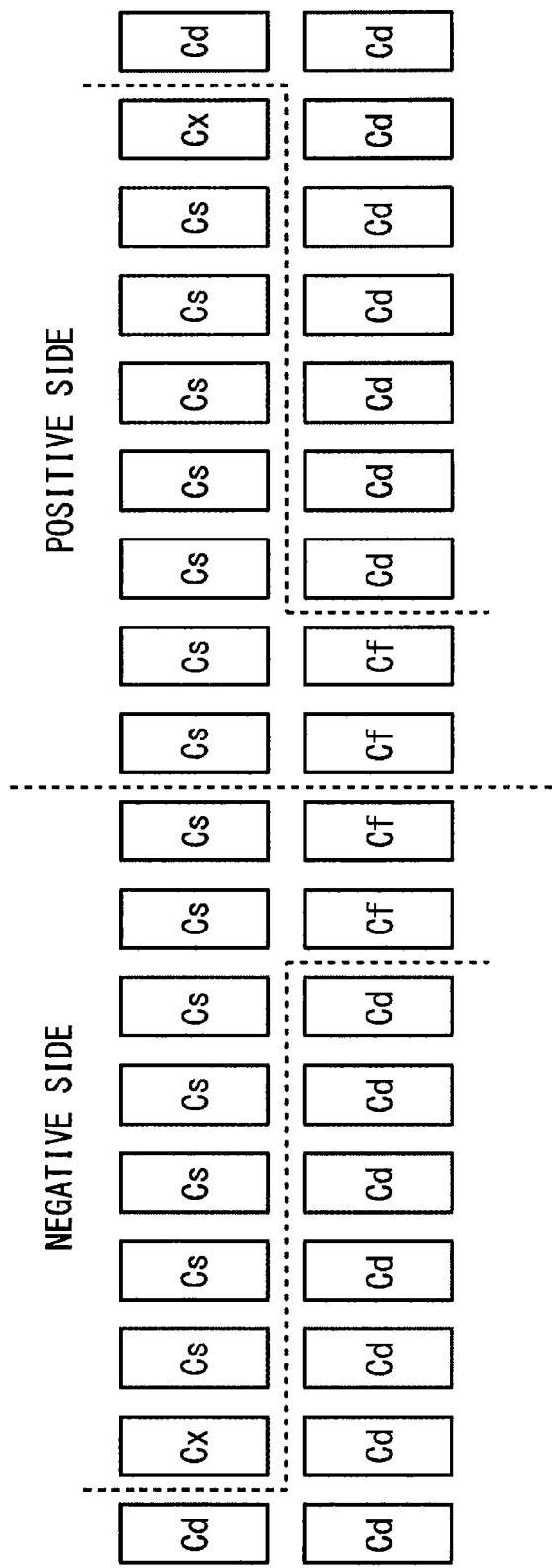
FIG. 7 is an illustration showing an exemplary arrangement of capacitors contained in a switched-capacitor circuit according to a first embodiment within a semiconductor integrated device.

FIG. 7 is an illustration showing an exemplary arrangement of capacitors contained in a switched-capacitor circuit 300 according to the first embodiment within a semiconductor integrated device. This example represents a capacitor array circuit 100 for digital-to-analog conversion of 3 bits in binary code. As already described, seven input capacitors Cs in single configuration are required to perform a digital-to-analog conversion of 3 bits in binary code. Generally, the arrangement design of capacitors is done in units of multipliers of 2. Therefore eight capacitors are arranged. The eight capacitors are lined up at fixed intervals, with the seven of them used as the input capacitors Cs and the remaining one as the regulating capacitor Cx. In this example, the outermost capacitor of the eight capacitors is used as the regulating capacitor Cx.

Also, in the switched-capacitor circuit 300 of the first embodiment, two feedback capacitors Cf are required if the switched-capacitor circuit 300 is of a single configuration and the gain is 4 times. The two feedback capacitors Cf are placed in arbitrary positions on a line parallel to the seven input capacitors Cs and one regulating capacitor Cx arranged in a line. In this example, the two feedback capacitors Cf are placed near the two innermost ones of the eight capacitors with a predetermined spacing from them. Note that the ratio between the total size of the input capacitors Cs and the regulating capacitor Cx and the total size of the feedback capacitors Cf determine the gain of the switched-capacitor circuit 300.

There must be as little difference in the size and environmental conditions as possible for each of the plurality of capacitors arranged in a semiconductor integrated circuit if variation in their respective characteristics is to be suppressed and minimized. It is preferable therefore that capacitors of substantially the same size are placed around each of the seven input capacitors Cs and one regulating capacitor Cx which have much effect on accuracy. Thus, the capacitors of the same size are to be placed on the right or left of the seven input capacitors Cs and one regulating capacitor Cx and below them. That is, two feedback capacitors Cf and six dummy capacitors Cd are placed below the seven input capacitors Cs and one regulating capacitor Cx. Further, two dummy capacitors Cd are placed on the outer sides of those capacitors. And all those capacitors should be of the same size.

As described above, it is possible to make the effects of surrounding capacitors substantially the same for all of the input capacitors Cs, regulating capacitor Cx and feedback capacitors Cf. This arrangement may improve the accuracy of the digital-to-analog conversion by the capacitor array circuit 100.

Note here that at least one of the plurality of dummy capacitors Cd may be used as the additional regulating capacitor Cex. The additional regulating capacitor Cex, which is not used in digital-to-analog conversion, is not required to provide as much accuracy as the other capacitors. Therefore, the arrangement may be such that one in any position of the plurality of dummy capacitors Cd is used as the additional regulating capacitor Cex.

As described hereinabove, according to the first embodiment, regulating capacitors Cx and additional regulating capacitors Cex are provided within the capacitor array circuit 100, so that a single capacitor array circuit can compensate for both the offset voltage and the variance of common-mode voltage of the switched-capacitor circuit 300. Also, it is possible to add some regulating component to the output voltage of the switched-capacitor circuit 300 to meet other requirements. Moreover, use of the dummy capacitor Cd as the additional regulating capacitor Cex may prevent the increase in area of the capacitor array circuit 100 due to the addition of the additional regulating capacitor Cex.

Figure 8:
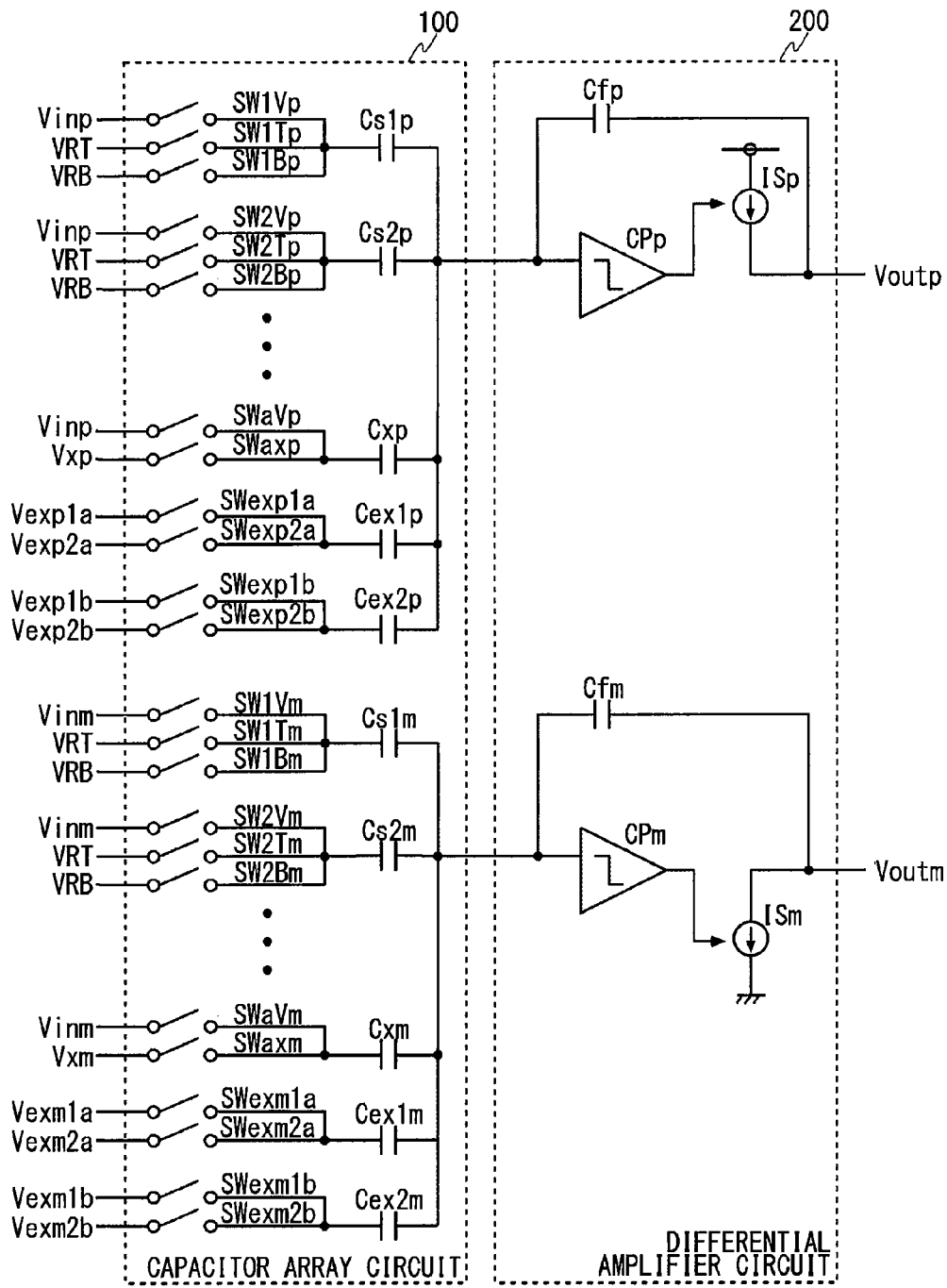
FIG. 8 is a configuration diagram of a switched-capacitor circuit incorporating a capacitor array circuit according to modification of a first embodiment.

FIG. 8 is a configuration diagram of the switched-capacitor circuit 300 incorporating a capacitor array circuit 100 according to modification of the first embodiment. The capacitor array circuit 100 according to the modification thereof is a circuit in which an additional regulating capacitor Cex is newly added as compared with the capacitor array circuit 100 shown in FIG. 1.

The positive-side capacitor array according to the modification of the first embodiment includes a plurality of positive-side input capacitors (Cs1p, Cs2p, . . . ), a positive-side regulating capacitor Cxp, a positive-side first additional regulating capacitor Cex1p, and a positive-side second additional regulating capacitor Cex2p. The respective output terminals of the plurality of positive-side input capacitors (Cs1p, Cs2p, . . . ), the positive-side regulating capacitor Cxp, the positive-side first additional regulating capacitor Cex1p, and the positive-side second additional regulating capacitor Cex2p are combined into one.

The negative-side capacitor array according to the modification thereof includes a plurality of negative-side input capacitors (Cs1m, Cs2m, . . . ), a negative-side regulating capacitor Cxm, a negative-side first additional regulating capacitor Cex1m, and a negative-side second additional regulating capacitor Cex2m. The respective output terminals of the plurality of negative-side input capacitors (Cs1m, Cs2m, . . . ), the negative-side regulating capacitor Cxm, the negative-side first additional regulating capacitor Cex1m, and the negative-side second additional regulating capacitor Cex2m are combined into one.

The input-side configurations of the positive-side second additional regulating capacitor Cex2p and the negative-side second additional regulating capacitor Cex2m are identical to those of the positive-side first additional regulating capacitor Cex1p and the negative-side first additional regulating capacitor Cex1m, and therefore the repeated description thereof is omitted here.

Shown here in FIG. 1 is a case where a single additional regulating capacitor Cex is added to each of the positive-side capacitor array and the negative-side capacitor array. However, a plurality of additional regulating capacitors may be newly added thereto. Also, The capacitance value of the first additional regulating capacitor Cex1 and the value of the second additional regulating capacitor Cex2 may differ from each other. For example, the latter may be twice as much as the former.

Four kinds of modes can be set. The four kinds of modes are a first mode where both the first additional regulating capacitor Cex1 and the second additional regulating capacitor Cex2 are disabled, a second mode where the first additional regulating capacitor Cex1 only is enabled, a third mode where the second additional regulating capacitor Cex2 only is enabled, and a fourth mode where both the first additional regulating capacitor Cex1 and the second additional regulating capacitor Cex2 are enabled.

By employing the present modification as described above, the increase in the number of additional regulating capacitors Cex allows a more carefully controlled and more sensitive processing. Also, when the offset voltage and/or the variance of common-mode voltage are/is to be compensated for, the number of additional regulating capacitors Cex used is selected from among a plurality of additional regulating capacitors Cex, so that the compensation value can be set digitally.

Though in the above-described first embodiment a description is given of an exemplary case where the comparator-based amplifier circuit is used for the differential amplifier circuit 200, the present embodiment is not limited thereto and, for example, a commonly-used virtually-grounded-type amplifier circuit may be used instead.

A description will now be given of a second embodiment. In the second embodiment, the description is mainly focused on a method for compensating for an offset components caused by the delay in the comparator-based amplifier circuit.

Figure 9A:
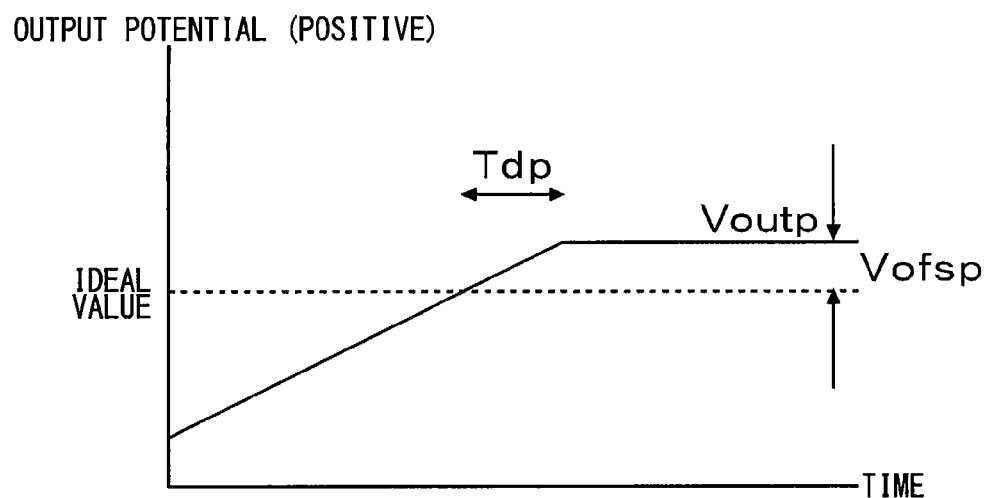
FIGS. 9A and 9B illustrate examples of output voltage in a comparator-based amplifier circuit.
Figure 9B:
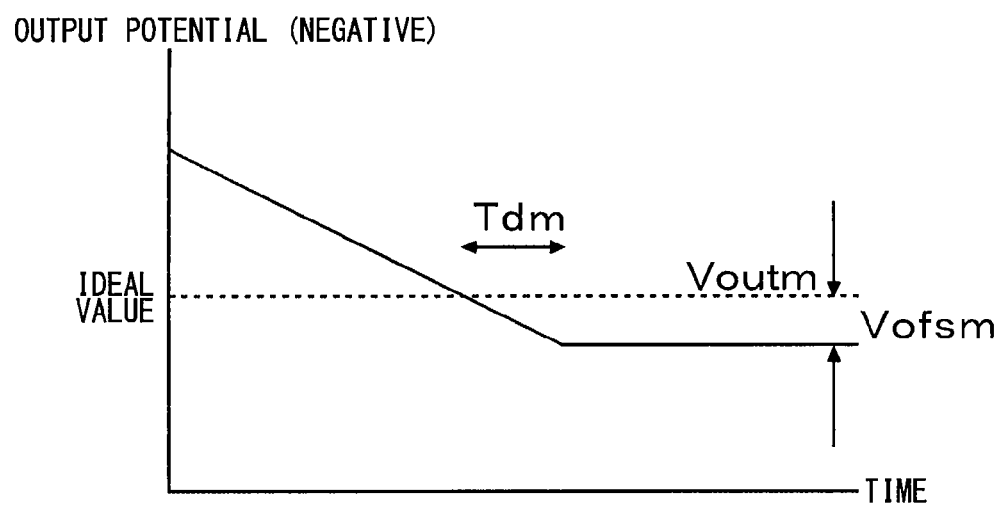

FIGS. 9A and 9B illustrate examples of output voltage in the comparator-based amplifier circuit. FIG. 9A illustrates an example of output voltage in a positive-side comparator-based amplifier circuit, and FIG. 9B illustrates an example of output voltage in a negative-side comparator-based amplifier circuit.

Ideal values shown in FIGS. 9A and 9BA indicate the values of the positive-side output voltage Voutp and the negative-side output voltage Voutm in the case where no delay occurs in the positive-side comparator CPp and the negative-side comparator CPm, respectively, and they have ideal characteristics.

In FIG. 9A, as the positive-side comparator CPp is delayed, the period during which the positive-side charge switch Mscp in FIG. 2 is on becomes longer and therefore the electric charge is excessively charged at the positive-side terminal. As a delay time Tdp is caused in the positive-side comparator CPp, the time at which the positive-side charge switch Mscp is tuned off will be delayed by as much as the delay time Tdp. As a result, an offset voltage Vofsp will be added to the positive-side output voltage Voutp.

In FIG. 9B, on the other hand, as the negative-side comparator CPm is delayed, the period during which the negative-side charge switch Mscm in FIG. 2 is on becomes longer and therefore the electric charge is excessively charged at the negative-side terminal. As a delay time Tdm is caused in the negative-side comparator CPm, the time at which the negative-side charge switch Mscm is tuned off will be delayed by as much as the delay time Tdm. As a result, an offset voltage Vofsm will be added to the negative-side output voltage Voutm.

In this manner, the offset voltage Vofs contained in the output voltage Vout increases in proportion to the delay time of the comparator CP. The delay time of the comparator CP varies due mainly to the process itself, supply voltage, and temperature. More specifically, the slower the process is and/or the lower the supply voltage is and/or the higher the temperature is, the greater the delay time of the comparator CP will be. Conversely, the faster the process is and/or the higher the supply voltage is and/or lower the temperature is, the smaller the delay time of the comparator CP will be.

Figure 10:
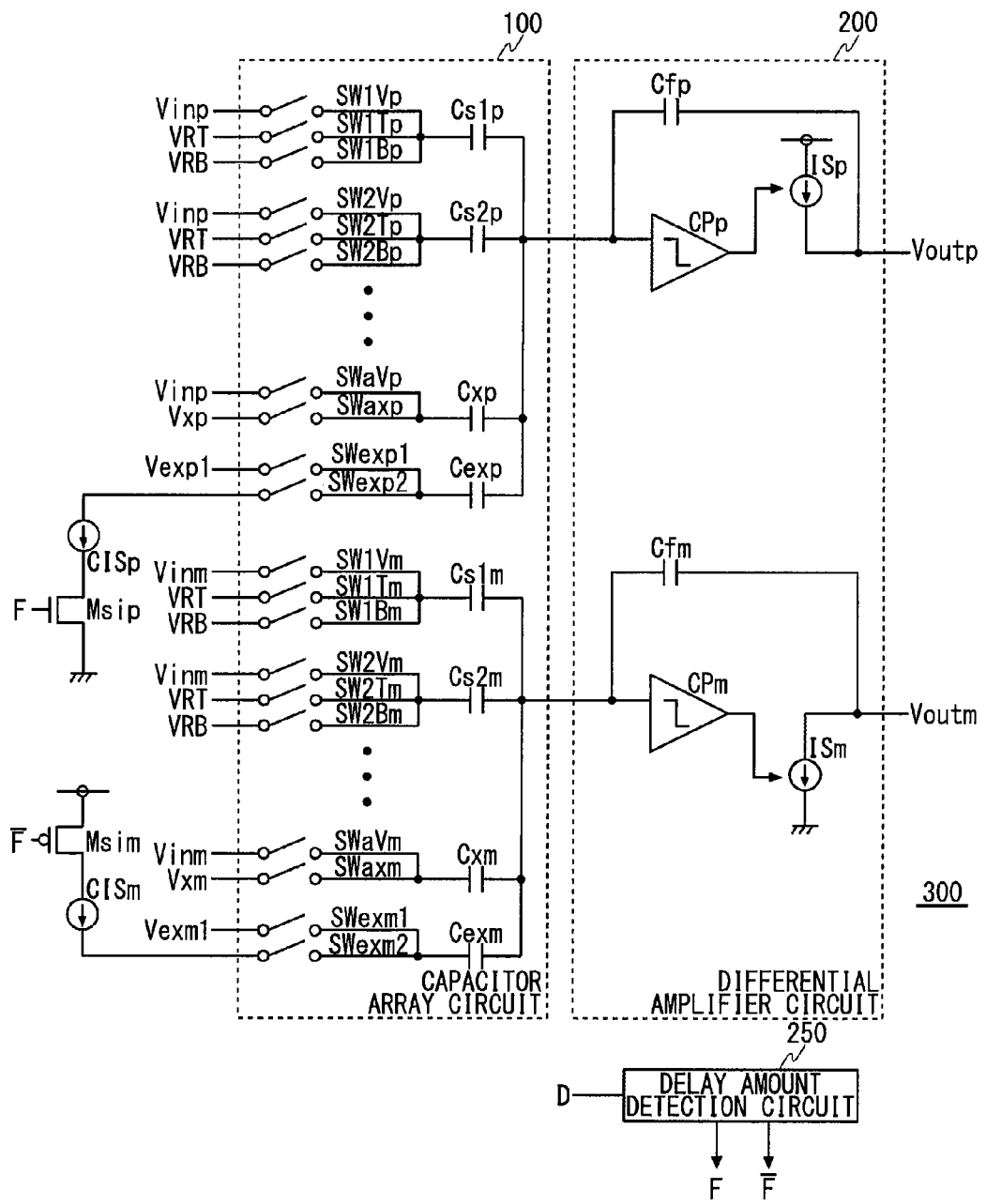
FIG. 10 is a configuration diagram of a switched-capacitor circuit according to a second embodiment of the present invention.

FIG. 10 is a configuration diagram of the switched-capacitor circuit 300 according to the second embodiment of the present invention. The configuration of the switched-capacitor circuit 300 according to the second embodiment is basically the same as that of the switched-capacitor circuit 300 according to the first embodiment. Differences in the configuration will be described hereinbelow.

The positive-side additional regulating capacitor Cexp stores the electric charge used to compensate for an offset component caused by the delay in the positive-side comparator CPp. The negative-side additional regulating capacitor Cexm stores the electric charge used to compensate for an offset component caused by the delay in the negative-side comparator CPm.

In addition to the structural components of the switched-capacitor circuit 300 according to the first embodiment, the switched-capacitor circuit 300 according to the second embodiment further includes a positive-side constant current source CISp, a positive-side constant current source switch Msip, a negative-side constant current source CISm, a negative-side constant current source switch Msim, and a delay amount detection circuit 250.

The positive-side constant current source CISp, which is connected to the input terminal of the positive-side additional regulating capacitor Cexp via the positive-side second additional regulating voltage switch SWexp2, pulls a constant current from the input terminal thereof. The negative-side constant current source CISm, which is connected to the input terminal of the negative-side additional regulating capacitor Cexm via the negative-side second additional regulating voltage switch SWexm2, discharges a constant current to the input terminal thereof.

The positive-side constant current source switch Msip is provided between the second fixed voltage source (ground voltage here) and the positive-side constant current source CISp. The negative-side constant current source switch Msim is provided between the first fixed voltage source (supply voltage here) and the negative-side constant current source CISm.

The positive-side constant current source switch Msip is configured by an N-channel transistor. A source terminal of the N channel transistor is connected to the second fixed voltage source (ground voltage here). A drain terminal thereof is connected to the positive-side constant current source CISp. A gate terminal thereof receives an output signal (signal F described later) of the delay amount detection circuit 250.

The negative-side constant current source switch Msim is configured by a P-channel transistor. A source terminal of the P channel transistor is connected to the first fixed voltage source (supply voltage here). A drain terminal thereof is connected to the negative-side constant current source CISm. A gate terminal thereof receives an output signal (inverted signal $\overline{F}$ described later, which is the inverted signal of signal F) of the delay amount detection circuit 250.

The delay amount detection circuit 250 includes a dummy delay circuit 51 (see FIG. 11) for estimating the delay time of the positive-side comparator CPp and the negative-side comparator CPm. The delay amount detection circuit 250 is placed near the positive-side comparator CPp and the negative-side comparator CPm.

The dummy delay circuit 51 may be comprised of the same inverter as that included in an inverter unit, or another delay circuit, which has the delay characteristics equivalent to or proportionate to the inverter unit, may be provided. As described above, the delay characteristics of the comparator CP vary due mainly to the process itself, supply voltage and temperature. Placing the dummy delay circuit 51 near the comparator CP enables the delay characteristics of the comparator CP to be dynamically estimated.

The delay amount detection circuit 250 determines the lengths of time during which the positive-side constant current source switch Msip and the negative-side constant current source switch Msim are on, based on the delay time of the comparator CP estimated by the dummy delay circuit 51. The on and off control of the constant current switches will be described later. It is to be noted here that there may be provided two separate delay amount detection circuits 250 on the positive side and the negative side, independently.

Figure 11:
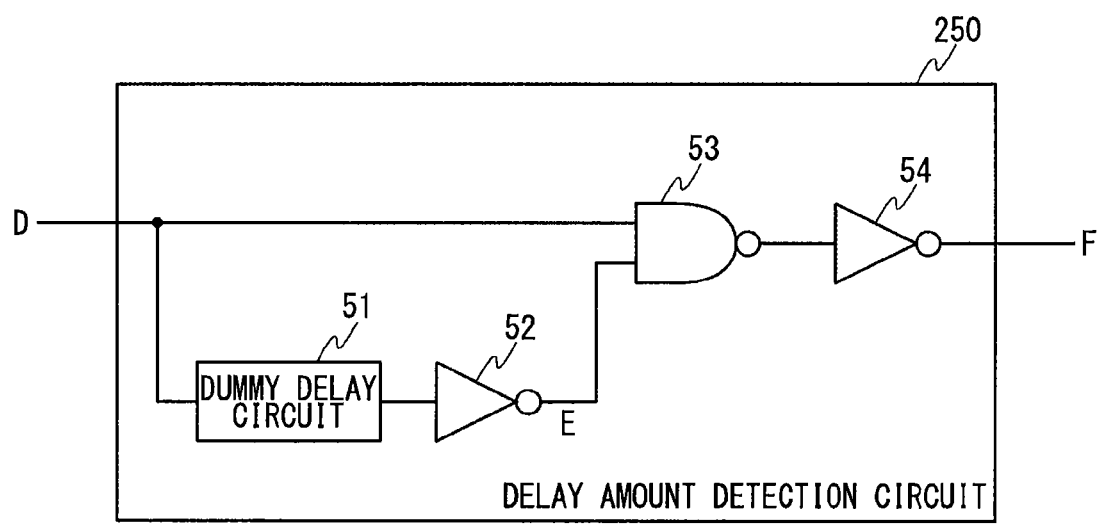
FIG. 11 illustrates an example of the internal configuration of a delay amount detection circuit.

FIG. 11 illustrates an example of the internal configuration of the delay amount detection circuit 250. The delay amount detection circuit 250 includes a dummy delay circuit 51, an inverter 52, a NAND gate 53, and an inverter 54. The dummy delay circuit 51 and the NAND gate 53 receives signal D in parallel. The dummy delay circuit 51 delays the inputted signal D and outputs it to the inverter 52. The inverter 52 outputs signal E, which is the inversion of the signal inputted from the dummy delay circuit 51, to the NAND gate 53.

The NAND gate 53 outputs a NAND signal of the signal D and the signal E to the inverter 54. The inverter 54 outputs signal F that is the inversion of the signal inputted from the NAND gate 53.

Figure 12:
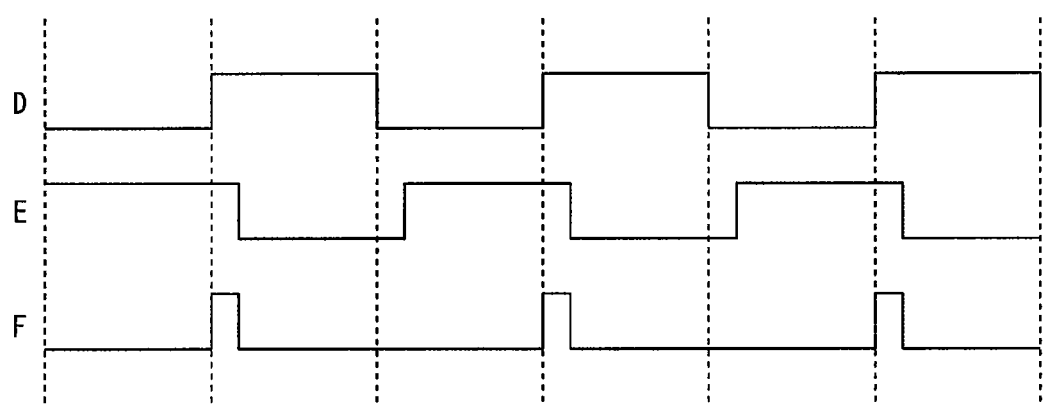
FIG. 12 illustrates examples of signal D, signal E, and signal F.

FIG. 12 illustrates examples of signal D, signal E, and signal F. The signal D is a clock signal whose duty ratio is 1/2. The half cycle of this clock signal corresponds to the length of an amplification period of the comparator CP. The signal E is a signal that is the inversion of the signal D delayed by the dummy delay circuit 51. The signal F is a signal for which the period corresponding to the delay amount by the dummy delay circuit 51 is extracted as a significant signal (high level signal here).

Figure 13:
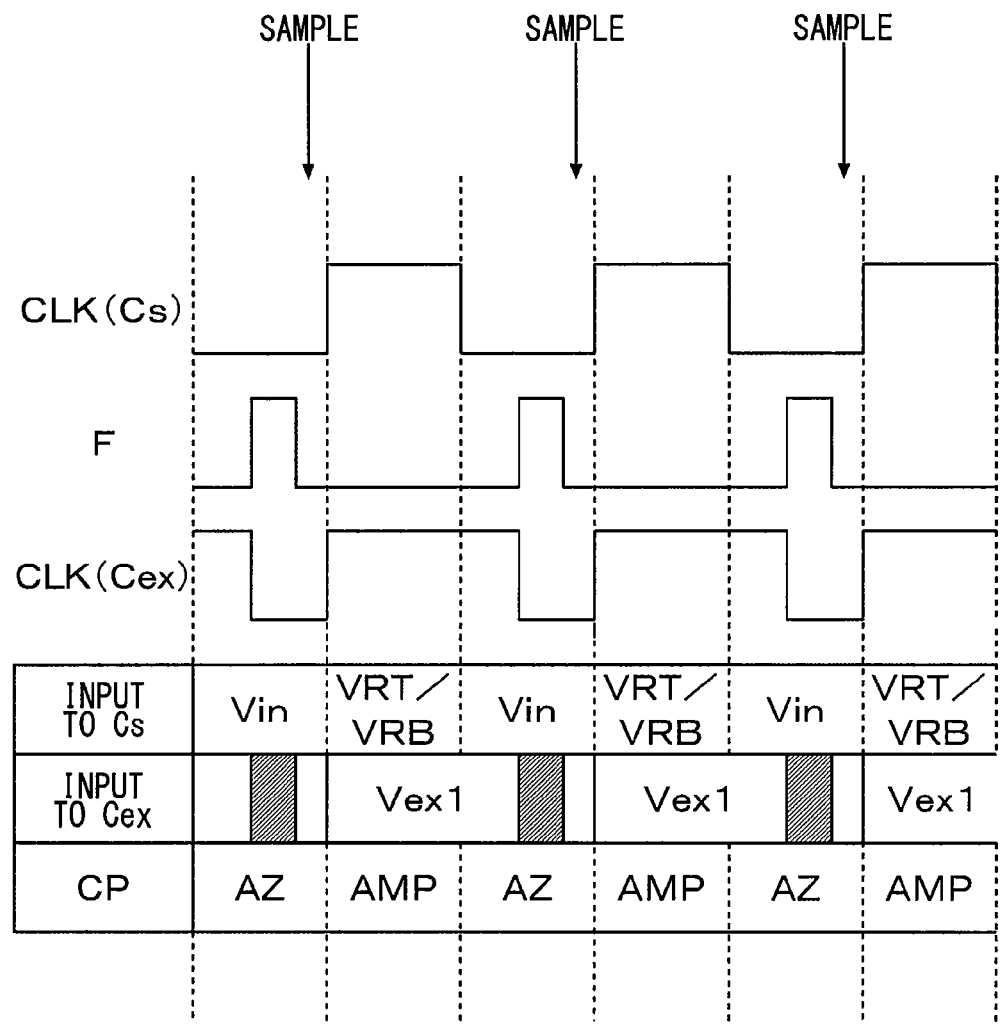
FIG. 13 is a timing chart showing an operation of a switched-capacitor circuit according to a second embodiment of the present invention.

FIG. 13 is a timing chart showing an operation of the switched-capacitor circuit 300 according to the second embodiment of the present invention. In the timing chart of FIG. 13 that differs from the timing chart of FIG. 6, during the auto-zero periods of the positive-side comparator CPp and the negative-side comparator CPm, the positive-side first additional regulating voltage Vexp1 and the negative-side first additional regulating voltage Vexm1 are not inputted to the positive-side additional regulating capacitor Cexp and the negative-side additional regulating capacitor Cexm, respectively.

Instead, the input terminal voltage of the positive-side additional regulating capacitor Cexp charged by the positive-side constant current source CISp and the input terminal voltage of the negative-side additional regulating capacitor Cexm charged by the negative-side constant current source CISm are inputted thereto, respectively. Note that since the positive-side regulating capacitor Cxp and the negative-side regulating capacitor Cxm are given no attention in the second embodiment and are therefore ignored here.

During auto-zero periods of the positive-side comparator CPp and the negative-side comparator CPm, the positive-side input analog signal Vinp is inputted to the positive-side input capacitors (Cs1$p$, Cs2$p$, . . . ); the negative-side input analog signal Vinm is inputted to the negative-side input capacitors (Cs1$m$, Cs2$m$, . . . ). Also, the switches are so controlled that the positive-side first additional regulating voltage switch SWexp1 and the negative-side first additional regulating voltage switch SWexm1 are on and that the positive-side second additional regulating voltage switch SWexp2 and the negative-side second additional regulating voltage switch SWexm2 are off, until a midway point of the auto-zero period, namely before signal F becomes significant (goes high). Thus, the positive-side first additional regulating voltage Vexp1 is inputted to the positive-side additional regulating capacitor Cexp, and the negative-side first additional regulating voltage Vexm1 is inputted to the negative-side additional regulating capacitor Cexm, until a midway point of the auto-zero period.

Here, it is preferable that the positive-side first additional regulating voltage Vexp1 be set to a high voltage (e.g., supply voltage) in order that the positive-side constant current source CISp is easily operable in a saturated region. Also, it is preferable that the negative-side first additional regulating voltage Vexm1 be set to a low voltage (e.g., ground voltage) in order that the negative-side constant current source CISm is easily operable in a saturated region.

As the signal F becomes significant in a midway point of the auto-zero period, the switches are so controlled that the positive-side first additional regulating voltage switch SWexp1 and the negative-side first additional regulating voltage switch SWexm1 are off and that the positive-side second additional regulating voltage switch SWexp2 and the negative-side second additional regulating voltage switch SWexm2 are on. In this manner, the positive-side first additional regulating voltage switch SWexp1, the negative-side first additional regulating voltage switch SWexm1, the positive-side second additional regulating voltage switch SWexp2 and the negative-side second additional regulating voltage switch SWexm2 are controlled by a second clock signal CLK (Cep) differing from a first clock signal CLK (Cs) that controls the positive-side input capacitors (Cs1$p$, Cs2$p$, . . . ) and the negative-side input capacitors (Cs1$m$, Cs2$m$, . . . ). The second clock signal CLK (Cep) is a signal that becomes significant (goes high) from a rising edge of the first clock signal CLK (Cs) to a rising edge of signal F and that becomes nonsignificant (goes low) in the other periods.

The positive-side constant current source switch Msip and the negative-side constant current source switch Msim are on during a period from when signal F transits to being significant (going high) until when it transits to being nonsignificant (going low). As the signal F transits to being nonsignificant (going low), the positive-side constant current source switch Msip and the negative-side constant current source switch Msim are turned off.

As a result, the input terminal of the positive-side additional regulating capacitor Cexp and the input terminal of the negative-side additional regulating capacitor Cexm can be set to a voltage corresponding to an offset component caused by the delay in the positive-side comparator CPp and the negative-side comparator CPm. No signals is inputted to the positive-side additional regulating capacitor Cexp and the negative-side additional regulating capacitor Cexm during a period from when signal F transits to being nonsignificant (going low) until the auto-zero period ends. The periods shaded in FIG. 13 indicate periods during which the electric charges are supplied to the input terminal of the positive-side additional regulating capacitor Cexp and the input terminal of the negative-side additional regulating capacitor Cexm from the positive-side constant current source CISp and the positive-side constant current source CISm, respectively.

The positive-side input analog signal Vinp and the negative-side input analog signal Vinm at the end of the auto-zero periods become sampled values. In amplification periods of the positive-side comparator CPp and the negative-side comparator CPm, either the high-potential-side reference voltage VRT or low-potential-side reference voltage VRB is inputted to the positive-side input capacitors (Cs1p, Cs2p, ...) and the negative-side input capacitors (Cs1m, Cs2m, ...), respectively. Also, the positive-side first additional regulating voltage Vexp1 is inputted to the positive-side additional regulating capacitor Cexp, whereas the negative-side first additional regulating voltage Vexm1 is inputted to the negative-side additional regulating capacitor Cexm.

The above-described processing is summarized as follows. During the auto-zero periods of the comparators CP, the input analog signal Vin is inputted to the input terminal of the input capacitor Cs, and the first additional regulating voltage Vex1 and the voltage based on the current supplied from the constant current source CIS are inputted sequentially to the input terminal of the additional regulating capacitor Cex. During amplification periods of the comparators CP, the reference voltages Vref are inputted to the input terminal of the capacitors Cs, and the first additional regulating voltage Vex1 is inputted to the input terminal of the additional regulating capacitor Cex. The constant current source switch Msi is turned on for a length of time corresponding to the delay of the comparator CP during a part of the auto-zero period of the comparator CP (signal F being significant). As a result, the current is supplied from the constant current source CIS to the input terminal of the additional regulating capacitor Cex.

At least one of the first additional regulating voltage Vex1, the size of the transistors constituting the constant current source CIS and the capacitance value of the additional regulating capacitor Cex is adjusted, so that the offset component generated by the additional regulating capacitor Cex can be matched with the offset component caused by the delay in the comparator CP.

A detailed description is given hereinbelow of an exemplary case where there are provided fifteen positive-side input capacitors (Cs1p, Cs2p, ...), a single positive-side regulating capacitor Cxp, a single positive-side additional regulating capacitor Cexp, fifteen negative-side input capacitors (Cs1m, Cs2m, ...), a single negative-side regulating capacitor Cxm, and a single negative-side additional regulating capacitor Cexm. Assume in the following description that the capacitance value of each of these capacitors is the same. In practice, however, the positive-side additional regulating capacitor Cexp and the negative-side additional regulating capacitor Cexm may differ from the capacitance value of other capacitors.

At the end of the auto-zero period (at the time of sampling), the electric charge Q stored in all of the capacitors including the positive-side feedback capacitor Cfp and the negative-side feedback capacitor Cfm is defined by the following Equations (6) and (7). Equation (6) indicates a positive-side electric charge Qp, and Equation (7) indicates a negative-side electric charge Qm.

Since the capacitance values of the positive-side input capacitors (Cs1p, Cs2p, ...), the positive-side regulating capacitor Cxp, the negative-side input capacitors (Cs1m, Cs2m, ...) and the negative-side regulating capacitor Cxm are all the same, the capacitance value of each one of them will be denoted by Cs to simplify the equations. Also, since the capacitance value of the positive-side feedback capacitor Cfp and the capacitance value of the negative-side feedback capacitor Cfm are equal to each other, each of them will be denoted by Cf to simplify the equations.

$$Qp = Cs \cdot 16 \cdot (Vinp - Vazp) + Cf \cdot (VRB2 - Vazp) + Cexp \cdot (Vexp1 - Ip \cdot Tp - Vazp) \quad \text{Eq. (6)}$$

$$Qm = Cs \cdot 16 \cdot (Vinm - Vazm) + Cf \cdot (VRB2 - Vazm) + Cexm \cdot (Vexm1 + Im \cdot Tm - Vazm) \quad \text{Eq. (7)}$$

In Equation (6), Ip indicates the current flowing through the positive-side constant current source CISp, and Tp indicates the length of time during which the positive-side constant current source switch Msip is on. In Equation (7), Im indicates the current flowing through the negative-side constant current source CISm, and Tm indicates the length of time during which the negative-side constant current source switch Msim is on.

Next, in an amplified state, the following Equation (8) defines the electric charge Qp stored in all of the positive-side capacitors at the time when the input terminal voltage of the positive-side comparator CPp has reached the positive-side auto-zero voltage Vazp. Also, in the amplified state, the following Equation (9) defines the electric charge Qm stored in all of the negative-side capacitors at the time when the input terminal voltage of the negative-side comparator CPm has reached the negative-side auto-zero voltage Vazm.

$$Qp = Cs \cdot \{n \cdot VRT + (15-n) \cdot VRB + Vxp - 16 \cdot Vazp\} + Cf \cdot (Voutp - Vazp) + Cexp \cdot (Vexp1 - Vazp) \quad \text{Eq. (8)}$$

$$Qm = Cs \cdot \{n \cdot VRB + (15-n) \cdot VRT + Vxm - 16 \cdot Vazm\} + Cf \cdot (Voutm - Vazm) + Cexm \cdot (Vexm1 - Vazm) \quad \text{Eq. (9)}$$

In Equation (8), n indicates the number of input capacitors Csp to which the high-potential-side reference voltage VRT is inputted in the positive-side input capacitors Csp.

The law of conservation of electric charges holds in the auto-zero state and in a state in which the input terminal voltage of the comparator CP has reached the auto-zero voltage. Thus, the output voltage, which is (Voutp−Voutm) of the differential amplifier circuit 200, is defined by the following Equation (10) using Equation (10).

$$Voutp - Voutm = 4 \cdot \{16 \cdot (Vinp - Vinm)) - ((2n-15)/8) \cdot (VRT - VRB) + (Vxp - Vxm)/16\} - Cexp \cdot Ip \cdot Tp + Cexm \cdot Im \sim Tm \quad \text{Eq. (10)}$$

By employing the second embodiment described as above, the effect of the offset component caused by the delay in the comparators can be reduced. Also, the use of the dummy delay circuit can adaptively compensate for the offset components that dynamically vary due to environment conditions such as the process itself, supply voltage and temperature.

Figure 14:
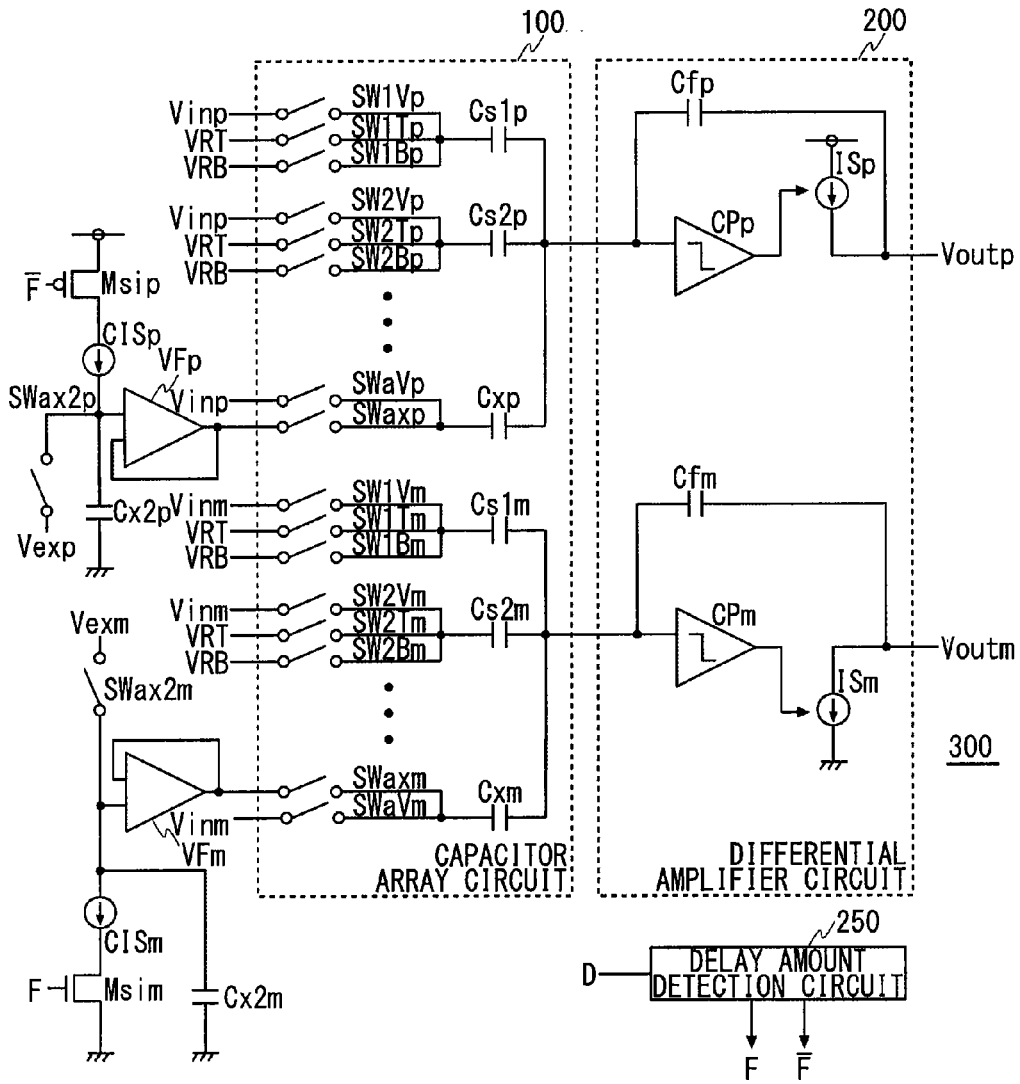
FIG. 14 is a configuration diagram of a switched-capacitor circuit according to a first modification of a second embodiment.

FIG. 14 is a configuration diagram of a switched-capacitor circuit 300 according to a first modification of the second embodiment. The configuration of the switched-capacitor circuit 300 according to the first modification of the second embodiment is basically the same as that of the switched-capacitor circuit 300 according to the first embodiment. Differences in the configuration will be described hereinbelow. Though the positive-side additional regulating capacitor Cexp and the negative-side additional regulating capacitor Cexm are not shown in FIG. 14, the positive-side additional regulating capacitor Cexp and the negative-side additional regulating capacitor Cexm may be provided or not provided at all.

In addition to the structural components of the switched-capacitor circuit 300 according to the first embodiment, the switched-capacitor circuit 300 according to the first modification of the second embodiment further includes a positive-side constant current source CISp, a positive-side constant current source switch Msip, a positive-side voltage follower VFp, a positive-side retention capacitor Cx2$p$, a positive-side second regulating voltage switch SWax2$p$, a negative-side constant current source CISm, a negative-side constant current source switch Msim, a negative-side voltage follower VFm, a negative-side retention capacitor Cx2$m$, a negative-side second regulating voltage switch SWax2$m$, and a delay amount detection circuit 250.

One end of the positive-side constant current source CISp is connected to the first fixed voltage source (supply voltage here) via the positive-side constant current source switch Msip, whereas the other end of the positive-side constant current source CISp is connected to the input terminal of the positive-side voltage follower VFp and one end of the positive-side retention capacitor Cx2$p$. The output terminal of the positive-side voltage follower VFp is connected to the positive-side regulating capacitor Cxp via the positive-side regulating voltage switch SWaxp. The other end of the positive-side retention capacitor Cx2$p$ is connected to the second fixed voltage source (ground voltage here). One end of the positive-side second regulating voltage switch SWax2$p$ receives the positive-side regulating voltage Vexp, whereas the other end of the positive-side second regulating voltage switch SWax2$p$ is connected to the input terminal of the positive-side voltage follower VFp and the one end of the positive-side retention capacitor Cx2$p$.

One end of the negative-side constant current source CISm is connected to the second fixed voltage source (ground voltage here) via the negative-side constant current source switch Msim, whereas the other end of the negative-side constant current source CISm is connected to the input terminal of the negative-side voltage follower VFm and one end of the negative-side retention capacitor Cx2$m$. The output terminal of the negative-side voltage follower VFm is connected to the negative-side regulating capacitor Cxm via the negative-side regulating voltage switch SWaxm. The other end of the negative-side retention capacitor Cx2$m$ is connected to the second fixed voltage source (ground voltage here). One end of the negative-side second regulating voltage switch SWax2$m$ receives the negative-side regulating voltage Vexm, whereas the other end of the negative-side second regulating voltage switch SWax2$m$ is connected to the input terminal of the negative-side voltage follower VFm and the one end of the negative-side retention capacitor Cx2$m$.

The positive-side constant current source switch Msip is configured by a P-channel transistor. The gate terminal thereof receives an output signal (inverted signal $\overline{F}$ described later, which is the inverted signal of signal F) of the delay amount detection circuit 250. The negative-side constant current source switch Msim is configured by an N-channel transistor. The gate terminal thereof receives an output signal (signal F described later) of the delay amount detection circuit 250.

Figure 15:
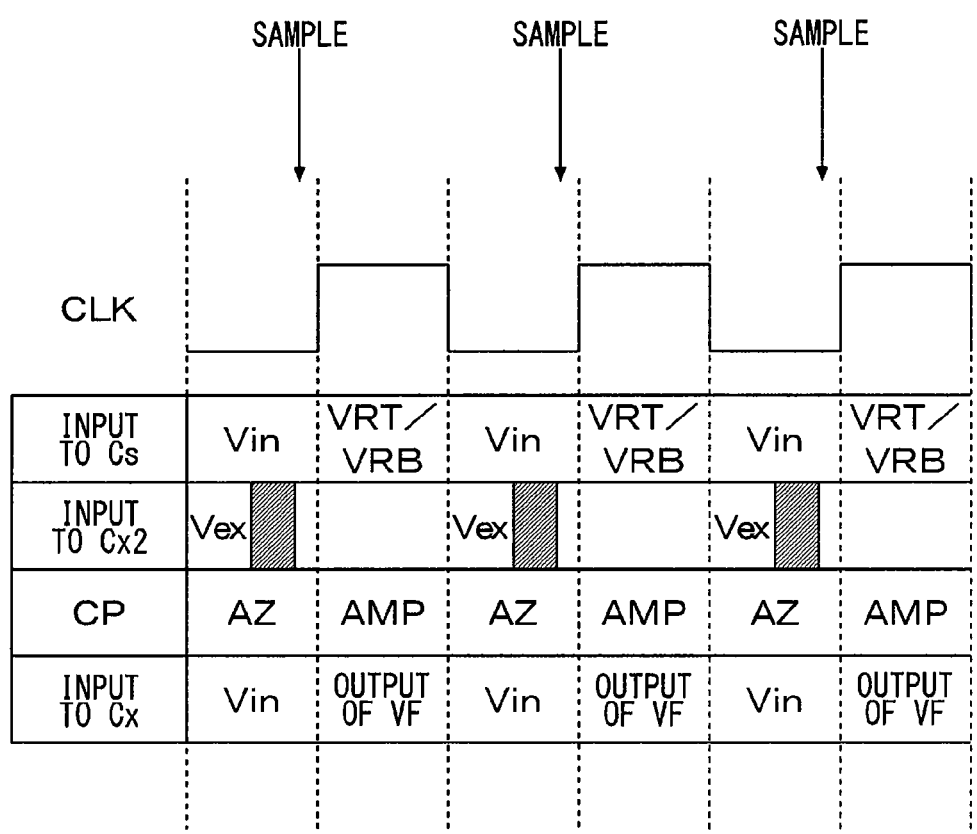
FIG. 15 is a timing chart showing an operation of a switched-capacitor circuit according to a first modification of a second embodiment.

FIG. 15 is a timing chart showing an operation of the switched-capacitor circuit 300 according to the first modification of the second embodiment. During the auto-zero periods of the positive-side comparator CPp and the negative-side comparator CPm, the positive-side input analog signal Vinp is inputted to the positive-side input capacitors (Cs1$p$, Cs2$p$, ... ) and the positive-side regulating capacitor Cxp, and the negative-side input analog signal Vinm is inputted to the negative-side input capacitors (Cs1$m$, Cs2$m$, ... ) and the negative-side regulating capacitor Cxm.

Also, the switches are so controlled that the positive-side second regulating voltage switch SWax2$p$ and the negative-side second regulating voltage switch SWax2$m$ are on and that the positive-side constant current source switch Msip and the negative-side constant current source switch Msim are off, until a midway point of the auto-zero period (e.g., during the first half of the auto-zero period). Thus, the positive-side regulating voltage Vexp is inputted to the positive-side retention capacitor Cx2$p$, and the negative-side regulating voltage Vexm is inputted to the negative-side retention capacitor Cx2$m$, until the midway point of the auto-zero period.

In a midway point of the auto-zero period, the switches are so controlled that the positive-side second regulating voltage switch SWax2$p$ and the negative-side second regulating voltage switch SWax2$m$ are off and that the positive-side constant current source switch Msip and the negative-side constant current switch Msim are on. The positive-side constant current source switch Msip and the negative-side constant current switch Msim are turned on for a length of time during which signal F is significant (going high). As the signal F transits to being nonsignificant (going low), the positive-side constant current source switch Msip and the negative-side constant current source switch Msim are turned off. For a length of time during which the positive-side constant current source switch Msip and the negative-side constant current source switch Msim are turned on, a current corresponding to an offset component caused by the delay in the positive-side comparator CPp and the negative-side comparator CPm is inputted to the positive-side retention capacitor Cx2$p$ and the negative-side retention capacitor Cx2$m$, respectively.

The positive-side input analog signal Vinp and the negative-side input analog signal Vinm at the end of the auto-zero periods become sampled values. In amplification periods of the positive-side comparator CPp and the negative-side comparator CPm, either the high-potential-side reference voltage VRT or low-potential-side reference voltage VRB is inputted to the positive-side input capacitors (Cs1$p$, Cs2$p$, ... ) and the negative-side input capacitors (Cs1$m$, Cs2$m$, ... ), respectively. Also, the output voltage of the positive-side voltage follower VFp is inputted to the positive-side regulating capacitor Cxp, whereas the output voltage of the negative-side voltage follower VFm is inputted to the negative-side regulating capacitor Cxm.

No signals is inputted to the positive-side retention capacitor Cx2$p$ and the negative-side retention capacitor Cx2$m$ during a period from when signal F transits to being nonsignificant (going low) until the amplification period ends. In other words, the switches are so controlled that the positive-side second regulating voltage switch SWax2$p$ and the negative-side second regulating voltage switch SWax2$m$, the positive-side constant current source switch Msip and the negative-side constant current switch Msim are all off.

In the second modification, at the end of the auto-zero period (at the time of sampling), the electric charge Q stored in all of the capacitors including the positive-side feedback capacitor Cfp and the negative-side feedback capacitor Cfm is defined by the following Equations (11) and (12). Equation (11) indicates a positive-side electric charge Qp, and Equation (12) indicates a negative-side electric charge Qm.

$$Qp = Cs \cdot 16 \cdot (Vinp - Vazp) + Cf \cdot (VRB2 - Vazp) + Cx2p \cdot (Vexp - Ip \cdot Tp - Vazp) \quad \text{Eq. (11)}$$

$$Qm = Cs \cdot 16 \cdot (Vinm - Vazm) + Cf \cdot (VRB2 - Vazm) + Ce2m \cdot (Vexm + Im \cdot Tm - Vazm) \quad \text{Eq. (12)}$$

In Equation (11), Ip indicates the current flowing through the positive-side constant current source CISp, and Tp indicates the length of time during which the positive-side constant current source switch Msip is on. In Equation (12), Im indicates the current flowing through the negative-side constant current source CISm, and Tm indicates the length of time during which the negative-side constant current source switch Msim is on.

By employing the first modification of the second embodiment described as above, the effect of the offset component caused by the delay in the comparators can be reduced as well. Also, the use of the dummy delay circuit can adaptively compensate for the offset components that dynamically vary due to environment conditions such as the process itself, supply voltage and temperature.

Also, the positive-side regulating voltage Vexp, the negative-side regulating voltage Vexm, the current flowing through the positive-side constant current source CISp, the current flowing through the negative-side constant current source CISm, the ON-time of the positive-side constant current source switch Msip and the ON-time of the negative-side constant current source switch Msim are adjusted, so that the differential offset of the output voltage of the switched-capacitor circuit 300 can be adjusted.

Note that the positive-side voltage follower VFp and the negative-side voltage follower VFm according to the second modification may be arranged differently as follows. That is, the positive-side voltage follower VFp may be inserted between the positive-side constant current source CISp and the positive-side second additional regulating voltage switch SWexp2 in the switched-capacitor circuit 300 shown FIG. 10; the negative-side voltage follower VFm may be inserted between the negative-side constant current source CISm and the negative-side second additional regulating voltage switch SWexm2 in the switched-capacitor circuit 300 shown in FIG. 10. This configuration also applies to a switched-capacitor circuit 300 shown FIG. 23 discussed later.

Figure 16:
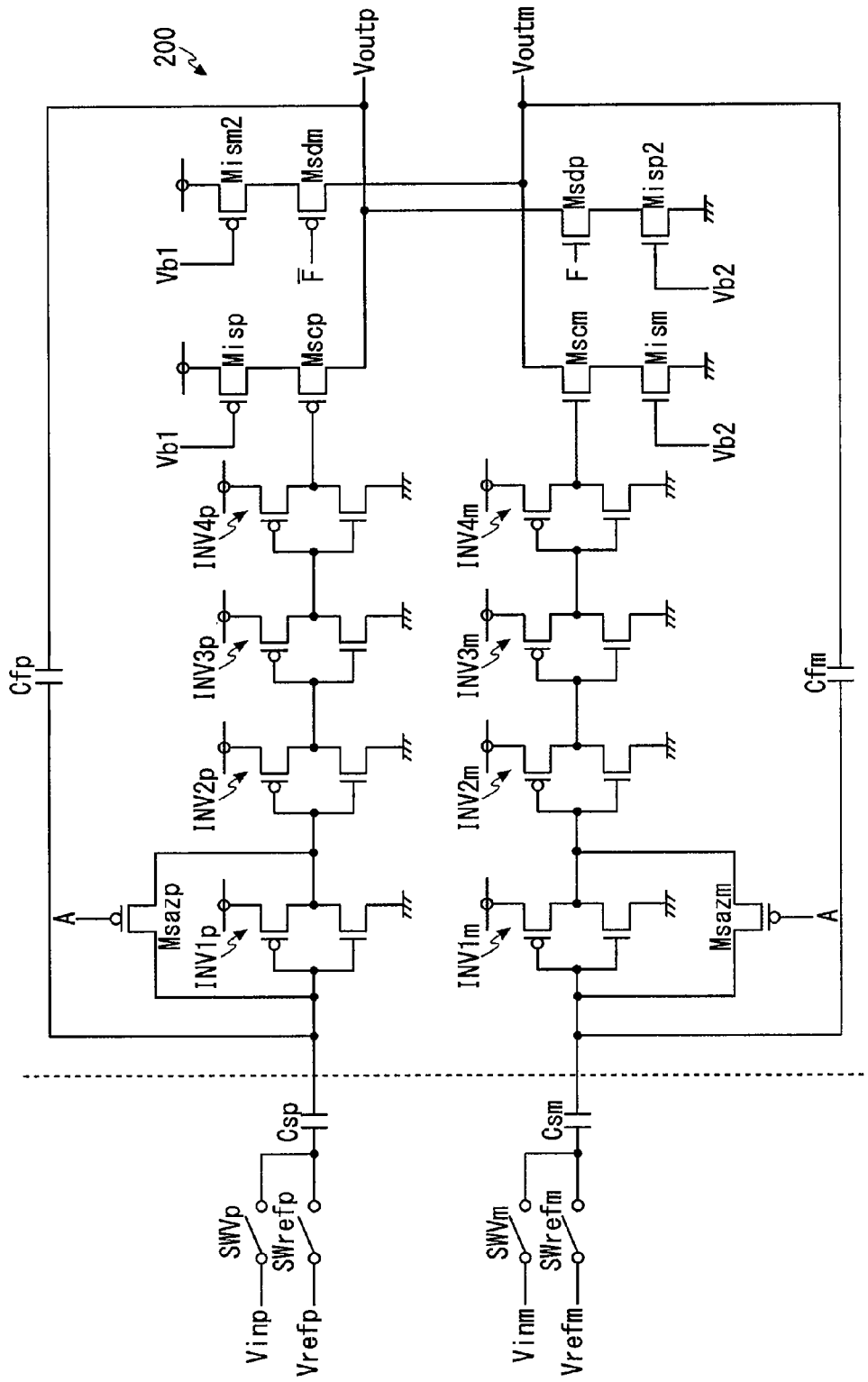
FIG. 16 illustrates an example of the internal configuration of a differential amplifier circuit included in a switched-capacitor circuit according to a third embodiment of the present invention.

FIG. 16 illustrates an example of the internal configuration of a differential amplifier circuit included in a switched-capacitor circuit 300 according to a third embodiment of the present invention. The internal circuit of the differential amplifier circuit 200 shown in FIG. 16 is configured such that a positive-side additional constant current source Misp2, a positive-side discharge switch Msdp, a negative-side additional constant current source Mism2 and a negative-side discharge switch Msdm are newly added to the internal circuit of the differential amplifier circuit 200 shown in FIG. 2. To simplify the Figure, the positive-side intermediate reference potential switch SWmp, the negative-side intermediate reference potential switch SWmm, the positive-side reset switch Msrp and the negative-side reset switch Msrm are omitted in FIG. 16.

The positive-side additional constant current source Misp2 and the positive-side discharge switch Msdp are each configured by an N-channel transistor. A source terminal of the N-channel transistor constituting the positive-side additional constant current source Misp2 is connected to the second fixed voltage source (ground voltage here). A drain terminal thereof is connected to the positive-side discharge switch Msdp. The aforementioned second bias voltage Vb2 is applied to a gate terminal thereof.

A source terminal of the N-channel transistor constituting the positive-side discharge switch Msdp is connected to the positive-side additional constant current source Misp2. A drain terminal thereof is connected to the positive-side output terminal of the differential amplifier circuit 200. A gate terminal thereof receives the aforementioned signal F.

The negative-side additional constant current source Mism2 and the negative-side discharge switch Msdm are each configured by a P-channel transistor. A source terminal of the P-channel transistor constituting the negative-side additional constant current source Mism2 is connected to the first fixed voltage source (supply voltage here). A drain terminal thereof is connected to the negative-side discharge switch Msdm. The aforementioned first bias voltage Vb1 is applied to a gate thereof.

A source terminal of the P-channel transistor constituting the negative-side discharge switch Msdm is connected to the negative-side additional constant current source Mism2. A drain terminal thereof is connected to the negative-side output terminal of the differential amplifier circuit 200. A gate terminal thereof receives the aforementioned inverted signal $\overline{F}$.

After the state of the positive-side charge switch Mscp has transited from ON to OFF, the positive-side discharge switch Msdp is turned on for a length of time during which the aforementioned signal F goes high. Turning on the positive-side discharge switch Msdp allows the discharging of the electric charge which has been excessively charged at the positive-side output terminal of the differential amplifier circuit 200. After the state of the negative-side charge switch Mscm has transited from ON to OFF, the negative-side discharge switch Msdm is turned on for a length of time during which the aforementioned inverted signal $\overline{F}$ goes low. Turning on the negative-side discharge switch Msdm allows the discharging of the electric charge which has been excessively charged at the negative-side output terminal of the differential amplifier circuit 200.

Figure 17A:
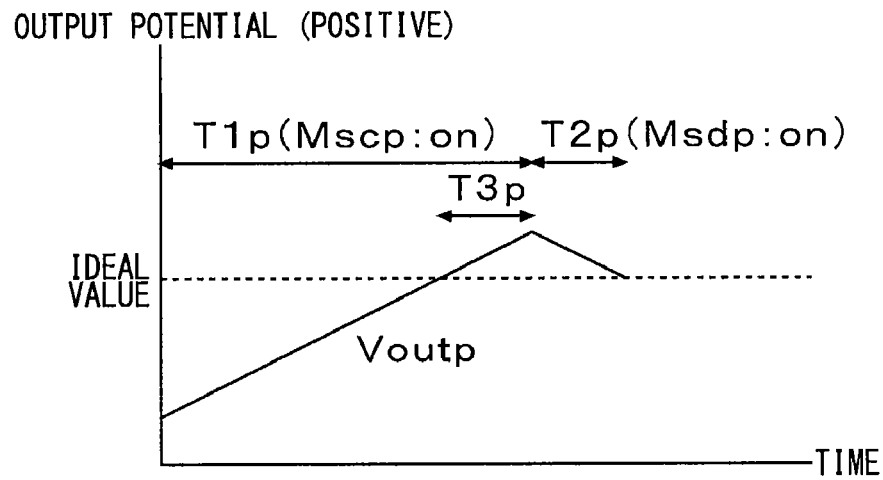
FIGS. 17A and 17B illustrate examples of output voltage of a differential amplifier circuit according to a third embodiment.
Figure 17B:
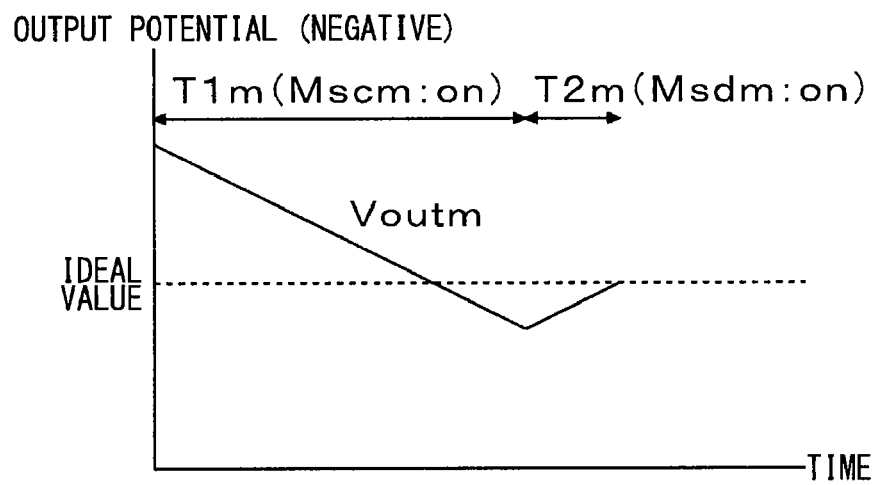

FIGS. 17A and 17B illustrate examples of output voltage of the differential amplifier circuit 200 according to the third embodiment. FIG. 17A illustrates an example of output voltage Voutp in a positive-side comparator-based amplifier circuit that constitutes the differential amplifier circuit 200, and FIG. 17B illustrates an example of output voltage Voutm in the negative-side comparator-based amplifier circuit that constitutes the differential amplifier circuit 200.

In FIG. 17A, a positive-side charging period T1$p$ indicates the period during which the positive-side charge switch Mscp is on, and a positive-side discharging period T2$p$ indicates the period during which the positive-side discharge switch Msdp is on. A positive-side overcharging period T3$p$ indicates an overcharged period, which is caused by the delay in the positive-side comparator CPp and which has elapsed after an ideal value has been reached. As a result of the overcharged period, the positive-side offset voltage Vofsp is added to the positive-side output voltage Voutp. To countermeasure this, turning on the positive-side discharge Msdp causes the electric charge to be discharged from the positive-side output terminal using the positive-side additional constant current source Misp2, which in turn compensates for the positive-side offset voltage Vofsp.

If the positive-side discharging period T2$p$ and the positive-side overcharging period T3$p$ are identical to each other and if the current values of the positive-side constant current source Misp and the positive-side additional constant current source Misp2 are equal to each other, the positive-side offset voltage Vofsp can be completely compensated for. Also, the delay time of the positive-side comparator CPp and the length of time during which the positive-side charge switch Mscp is on may be designed differently from each other. For example, if the current drive capacity of the positive-side constant current source Misp is set to the half of that of the positive-side additional constant current source Misp2, the length of time during which the positive-side charge switch Mscp is on may be the half of the delay time of the positive-side comparator CPp.

In FIG. 17B, a negative-side charging period T1$m$ indicates the period during which the negative-side charge switch Mscp is on, and a negative-side discharging period T2$m$ indicates the period during which the negative-side discharge switch Msdm is on. A negative-side overcharging period T3$m$ indicates an overcharged period, which is caused by the delay in the negative-side comparator CPm and which has elapsed after an ideal value has been reached. As a result of the overcharged period, the negative-side offset voltage Vofsm is added to the negative-side output voltage Voutm. To countermeasure this, turning on the negative-side discharge Msdm causes the electric charge to be discharged from the negative-side output terminal using the negative-side additional constant current source Mism2, which in turn compensates for the negative-side offset voltage Vofsm.

By employing the third embodiment described as above, the effect of the offset component attributable to the delay in the comparators can be reduced. Also, the use of the dummy delay circuit can adaptively compensate for the offset components that dynamically vary due to environment conditions such as the process itself, supply voltage and temperature.

Figure 18:
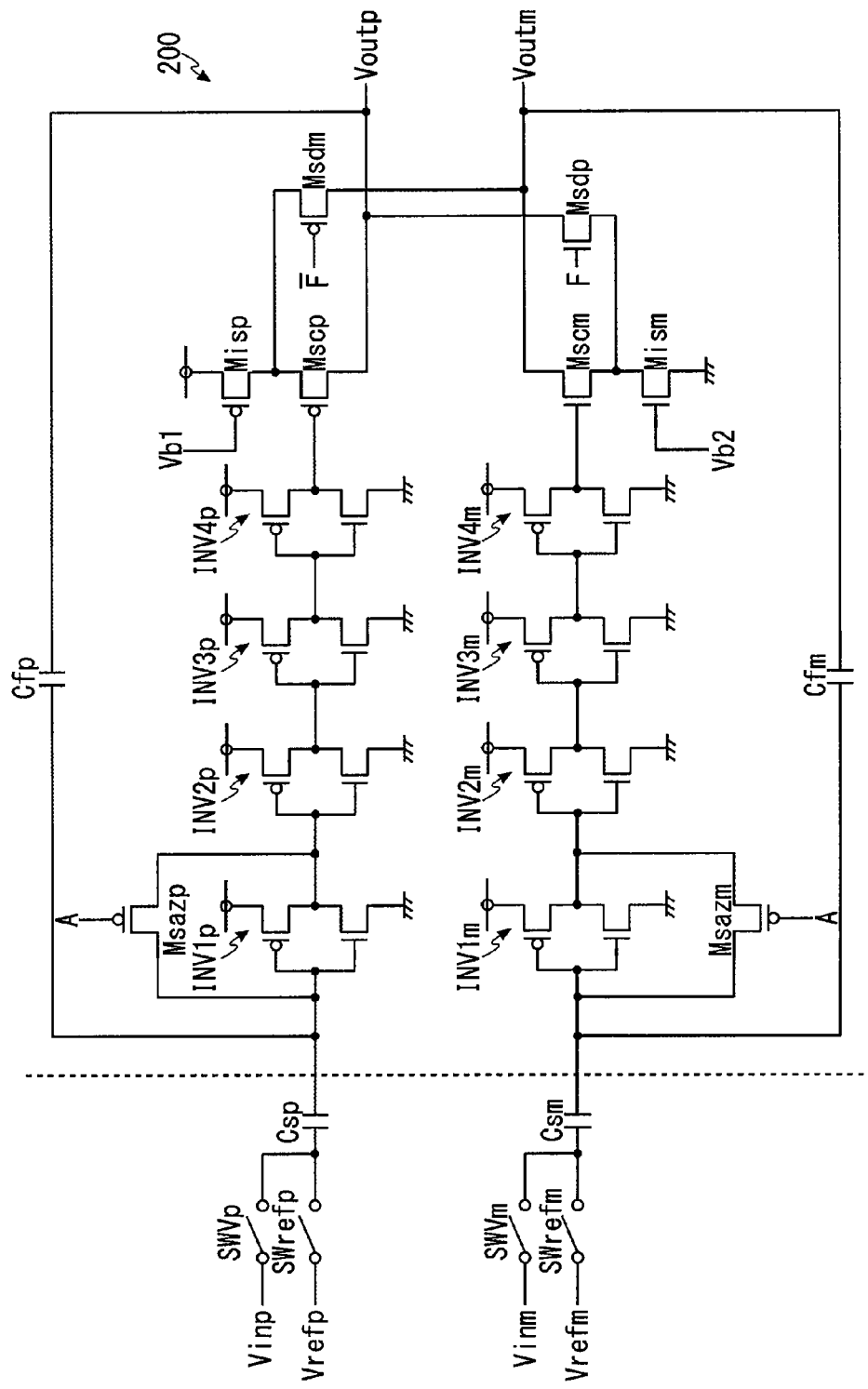
FIG. 18 illustrates an example of the internal configuration of a differential amplifier circuit included in a switched-capacitor circuit according to a modification of a third embodiment of the present invention.

FIG. 18 illustrates an example of the internal configuration of a differential amplifier circuit 200 included in the switched-capacitor circuit 300 according to a modification of the third embodiment. The internal circuit of the differential amplifier circuit 200 shown in FIG. 18 is configured such that the positive-side constant current source Misp and the negative-side additional constant current source Mism2 in the internal circuit of the differential amplifier circuit 200 shown in FIG. 16 are put to a common use and the negative-side constant current source Mism and the positive-side additional constant current source Misp2 therein are put to a common use.

That is, the drain terminal of the P channel transistor that constitutes the positive-side constant current source Misp is connected to both the source terminal of the P channel transistor that constitutes the positive-side charge switch Mscp and the source terminal of the P channel transistor that constitutes the negative-side discharge switch Msdm.

Also, the drain terminal of the N channel transistor that constitutes the negative-side constant current source Mism is connected to both the source terminal of the N channel transistor that constitutes the negative-side charge switch Mscm and the source terminal of the N channel transistor that constitutes the positive-side discharge switch Msdp.

By employing the modification of the third embodiment described as above, the effect of the offset component caused by the delay in the comparators can be reduced. Also, the use of the dummy delay circuit can adaptively compensate for the offset components that dynamically vary due to environment conditions such as the process itself, supply voltage and temperature. Further, the number of constant current sources can be reduced and the circuit scale can be reduced as compared with the internal configuration of the differential amplifier circuit 200 according to the basic third embodiment.

A description will now be given of an example where the switched-capacitor circuit 300 according to any of the first embodiment to the third embodiment is applied to the analog-to-digital converter. In particular, a description will be given of an example where it is applied to an analog-to-digital converter for converting input analog signals into digital signals from a higher-order bit toward a lower-order bit through a plurality of times of conversion processings. Examples for such the analog-to-digital converter include an analog-to-digital converter of a pipeline type and that of a cyclic type as follows.

Figure 19:
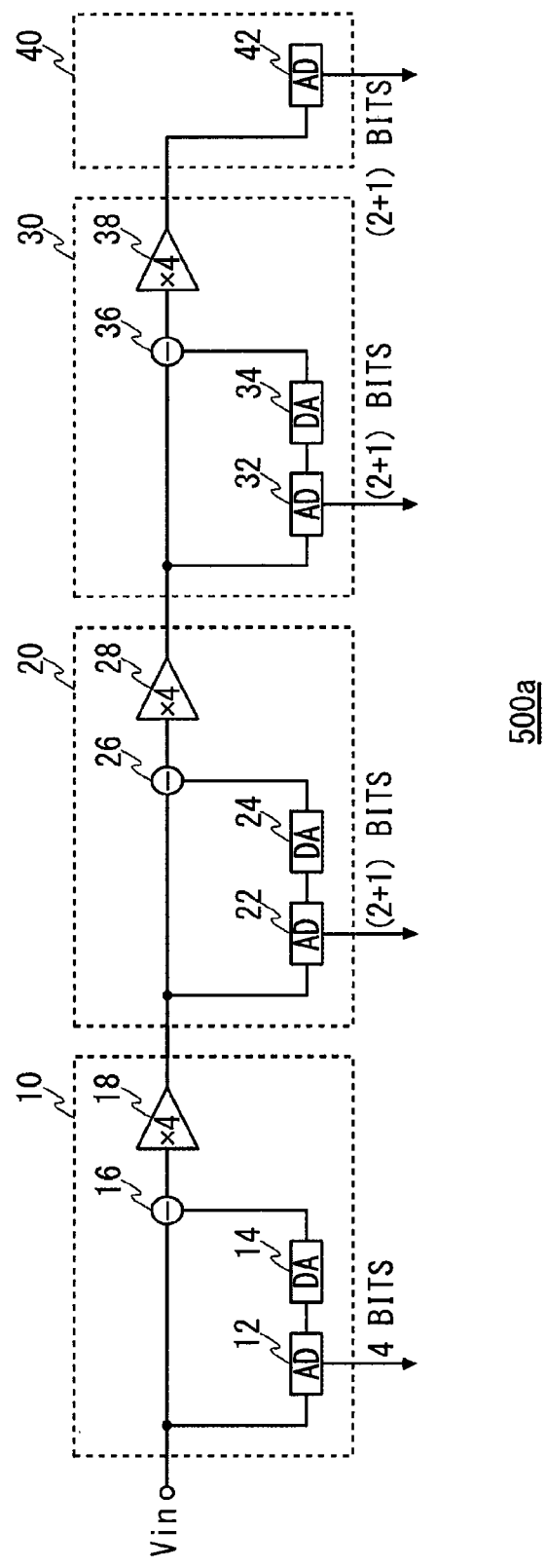
FIG. 19 illustrates a configuration of a pipeline-type analog-to-digital converter according to a first exemplary application.

FIG. 19 illustrates a configuration of a pipeline-type analog-to-digital (A-D) converter 500$a$ according to a first exemplary application. This pipeline-type A-D converter 500$a$ has four stages. The A-D converter 500$a$ is structured such that 4 bits are converted in a first stage 10 and 2 bits excluding a 1 redundant bit are converted in each of a second state 20, a third stage 30 and a fourth stage 40. Thus, the total of 10 bits is converted by the pipeline-type A-D converter 500$a$. It is to be noted here that the number of stages and the number of bits described above are merely exemplary and should not be considered as limiting.

The first stage 10 includes a first sub-A-D converter circuit 12, a first digital-to-analog (D-A) converter circuit 14, a first subtraction circuit 16, and a first amplifier circuit 18. The first sub-A-D converter circuit 12 and the first amplifier circuit 18 sample the input analog signal Vin with the practically identical timing.

The first sub-A-D converter circuit 12 is of a flash-type structure. As described above, the resolution, or the number of bits to be converted, is 4 bits. The first sub-A-D converter circuit 12 converts components equivalent to the higher-order 4 bits of a sampled signal into a digital value and outputs the digital value to the first D-A converter circuit 14 and a not-shown digital signal processing unit. The first D-A converter unit 14 converts the digital value, obtained after the conversion done by the first sub-A-D converter circuit 12, into an analog value. This analog signal is a signal which is to be removed from the analog signal converted by the first sub-A-D converter circuit 12.

The first subtraction circuit 16 subtracts the analog signal obtained after the conversion done by the first D-A converter circuit 14, from the input analog signal Vin sampled by the first amplifier circuit 18. The first amplifier circuit 18 amplifies a residual signal resulting from the subtraction of the former from the latter, by a predetermined gain so as to output the amplified residual signal to the second stage 20. Here, the signal is amplified by a factor of 4 (4×). The amplified residual signal is to be converted in the second stage 20.

The second stage 20 includes a second sub-A-D converter circuit 22, a second D-A converter circuit 24, a second subtraction circuit 26, and a second amplifier circuit 28. Both the second sub-A-D converter circuit 22 and the second amplifier circuit 28 sample the residual signal from the first stage 10 with the practically identical timing.

The second sub-A-D converter circuit 22 is of a flash-type structure. As described above, the resolution thereof is 3 bits if the 1 redundancy bit is included. The second sub-A-D converter circuit 22 converts components equivalent to the higher 5th and 6th bits into a digital value and adds a 1 redundancy bit so as to output them to the second D-A converter circuit 24 and the not-shown digital signal processing unit. The second D-A converter circuit 24 converts the output digital value of the second sub-A-D converter circuit 22 into an analog value.

The second subtraction circuit 26 subtracts the analog signal obtained after the conversion done by the second D-A converter circuit 24, from a residual signal outputted from the first stage 10. The second amplifier circuit 28 amplifies the residual signal resulting from the subtraction of the former from the latter, by a predetermined gain so as to output the amplified residual signal to the second stage 20. Here, the signal is amplified by a factor of 4 (4×).

The third stage 30 includes a third sub-A-D converter circuit 32, a third D-A converter circuit 34, a third subtraction circuit 36, and a third amplifier circuit 38. The third stage 30 converts components equivalent to the higher 7th and 8th bits into a digital value. The configuration of the third stage 30 is the same as that of the second stage 20 and therefore the repeated description thereof is omitted here.

The fourth stage 40 includes a fourth sub-A-D converter circuit 42. The fourth sub-A-D converter circuit 42 converts the residual signal inputted from the third stage 30, into a digital value. That is, the fourth sub-A-D converter circuit 42 converts components equivalent to the higher 9th and 10th bits into a digital value.

When the not-shown digital signal processing unit receives the output digital values of all the stages, namely, the first stage 10, the second stage 20, the third stage 30 and the fourth stage 40, the digital signal processing unit separates the redundancy bits from the output digital values so as to reconstruct the output digital values to a 10-bit digital value. Also, the digital signal processing unit coverts a thermometer-coded digital value outputted from each stage, into a binary coded digital value.

A circuit block comprised of the first D-A converter circuit 14, the first subtraction circuit 16 and the first amplifier circuit 18 in combination may be configured by the use of the switched-capacitor circuit 300 according to any of the first embodiment to the third embodiment. That is, the capacitor array circuit 100 functions as both the first D-A converter circuit 14 and the first subtraction circuit 16, and the differential amplifier circuit 20 functions as the first amplifier circuit 18. Also, a circuit block comprised of the second D-A converter circuit 24, the second subtraction circuit 26 and the second amplifier circuit 28 in combination may be configured by the use of the switched-capacitor circuit 300 according to any of the first embodiment to the third embodiment. Similarly, a circuit block comprised of the third D-A converter circuit 34, the third subtraction circuit 36 and the third amplifier circuit 38 in combination may be configured by the use of the switched-capacitor circuit 300 according to any of the first embodiment to the third embodiment.

Figure 20:
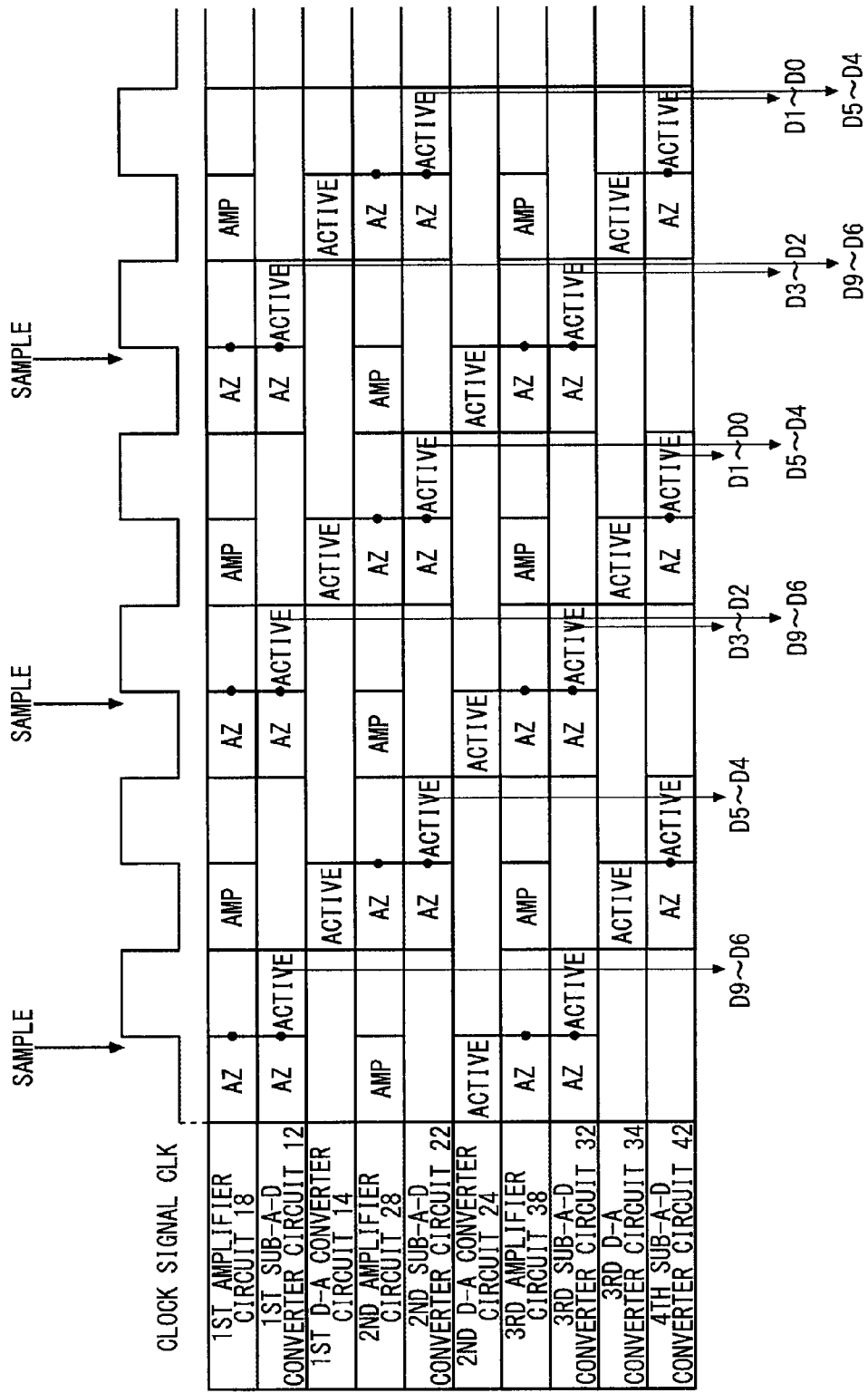
FIG. 20 is a timing chart showing an exemplary operation of a pipeline-type analog-to-digital converter as shown in FIG. 19.

FIG. 20 is a timing chart showing an exemplary operation of the pipeline-type A-D converter 500a as shown in FIG. 19. The sampling point (black circles in FIG. 20) in each of the first sub-A-D converter circuit 12, the first amplifier circuit 18, the second sub-A-D converter circuit 22, the second amplifier circuit 28, the third sub-A-D converter circuit 32, the third amplifier circuit 38 and the fourth sub-A-D converter circuit 42 is the end of each auto-zero period.

In the timing chart of FIG. 20, the first sub-A-D converter circuit 12 and the first amplifier circuit 18 sample the input analog single Vin once in every two cycles of the clock signal CLK. The first sub-A-D converter circuit 12 and the first amplifier circuit 18 are in the auto-zero states while the clock signal CLK is low in odd cycles; the input analog signal Vin is sampled on the rising edge timing of the clock signal CLK going high from low.

Following this, while the clock signal CLK is low in odd cycles, the first sub-A-D converter circuit 12 converts the sampled input analog signal Vin into a digital value of a predetermined number of bits (4 bits here). The first amplifier circuit 18 holds the sampled input analog signal Vin as it is.

Following this, while the clock signal CLK is low in even cycles, the first D-A converter circuit 14 converts the digital values converted by the first sub-A-D converter circuit 12 into an analog signal. Also, the first amplifier circuit 18 subtracts the digital value converted by the first D-A converter circuit 14 from the sampled input analog signal Vin and amplifies the result of the subtraction. This corresponds to the above-described state in which the reference voltage Vref is inputted to the input capacitors Cs and the amplifier circuit 200 performs amplification.

Also, the second sub-A-D converter circuit 22 and the second amplifier circuit 28 are in the auto-zero states while the clock signal CLK is low in even cycles; the output analog signal of the first amplifier circuit 18 is sampled on the rising edge timing of the clock signal CLK going high from low.

Following this, while the clock signal CLK is high in even cycles, the second sub-A-D converter circuit 22 converts the sampled analog signal outputted from the first amplifier circuit 18 into a digital value of a predetermined number of bits (2 bits here). The second amplifier circuit 28 holds the sampled analog signal outputted from the first amplifier circuit 18 as it is.

Following this, while the clock signal CLK is low in even cycles, the second D-A converter circuit 24 converts the digital values converted by the second sub-A-D converter circuit 12 into an analog signal. Also, the second amplifier circuit 28 subtracts the digital value converted by the second D-A converter circuit 24 from the sampled analog signal outputted from the first amplifier circuit 18 and amplifies the result of the subtraction.

Also, the third sub-A-D converter circuit 32 and the third amplifier circuit 38 are in the auto-zero states while the clock signal CLK is low in even cycles; the output analog signal of the second amplifier circuit 28 is sampled on the rising edge timing of the clock signal CLK going high from low.

Following this, while the clock signal CLK is high in even cycles, the third sub-A-D converter circuit 32 converts the sampled analog signal outputted from the second amplifier circuit 28 into a digital value of a predetermined number of bits (2 bits here). The third amplifier circuit 38 holds the sampled analog signal outputted from the second amplifier circuit 28 as it is.

Following this, while the clock signal CLK is low in odd cycles, the third D-A converter circuit 34 converts the digital values converted by the third sub-A-D converter circuit 32 into an analog signal. Also, the third amplifier circuit 38 subtracts the digital value converted by the third D-A converter circuit 34 from the sampled analog signal outputted from the second amplifier circuit 28 and amplifies the result of the subtraction.

Also, the fourth sub-A-D converter circuit 42 are in the auto-zero states while the clock signal CLK is low in odd cycles; the output analog signal of the third amplifier circuit 38 is sampled on the rising edge timing of the clock signal CLK going high from low.

Following this, while the clock signal CLK is high in odd cycles, the fourth sub-A-D converter circuit 42 converts the sampled analog signal outputted from the third amplifier circuit 38 into a digital value of a predetermined number of bits (2 bits here).

The above-described processings are concurrently executed with the clock signal CLK shifted by two cycles. In the timing chart of FIG. 20, two-line processings are simultaneously performed in parallel.

Where the comparator-based amplifier circuit is used in the pipeline-type A-D converter 500a, use of the first exemplary application described as above reduces the effect of the offset component attributable to the delay in the comparators. As a result, the analog-to-digital conversion can be achieved with high precision.

Figure 21:
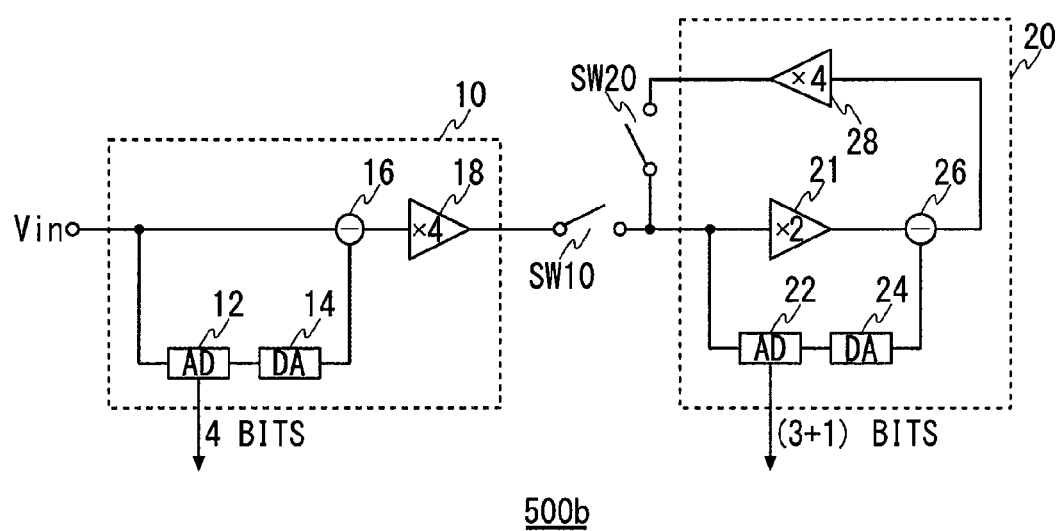
FIG. 21 illustrates a configuration of a cyclic-type analog-to-digital converter according to a second exemplary application.

FIG. 21 illustrates a configuration of a cyclic-type analog-to-digital (A-D) converter 500b according to a second exemplary application. The cyclic-type A-D converter 500b has two stages. That is, a first stage 10 converts part of an input signal into 4 bits; a second stage 20 converts it into 2 bits excluding a 1 redundancy bit. In the second stage 20, a residual signal outputted from the first stage 10 is circulated three times so as to be converted into the total of 6 bits. Hence, this cyclic-type A-D converter 500b converts the input signal into the total of 10 bits (4 bits in the first stage 10 and 6 bits in the second stage 20). It is to be noted here that the number of stages and the number of bits described above are merely exemplary and should not be considered as limiting.

The structure of the first stage 10 is the same as that of the first exemplary application and therefore the repeated description thereof is omitted here. The second stage 20 includes a second-first amplifier circuit 21, a second sub-A-D converter circuit 22, a second D-A converter circuit 24, a second subtraction circuit 26, and a second-second amplifier circuit 28. The second-first amplifier circuit 21 and the second sub-A-D converter circuit 22 sample a residual signal outputted from the first stage 10 or a residual signal fed back from the output of the second stage 20 with practically the same timing.

The second-first amplifier circuit 21 amplifies the sampled residual signal by a predetermined gain. In FIG. 21, the second-first amplifier circuit 21 amplifies it by 2×. The first sub-A-D converter circuit 22 is of a flash-type structure. As described earlier, the resolution is 3 bits including a 1 redundant bit. The second sub-A-D converter circuit 22 converts components equivalent to the higher 5th and 6th bits of a sampled signal (first cycle), those corresponding to the higher 7th and 8th bits thereof (second cycle) and those corresponding to 9th and 10th bits (third cycle) into a digital value, and adds a 1 redundancy bit so as to output them to the second D-A converter circuit 24 and a not-shown digital signal processing unit. The second D-A converter circuit 24 converts the output digital value of the second sub-A-D converter circuit 22 into an analog value.

The second subtraction circuit 26 subtracts the analog signal obtained after the conversion done by the second D-A converter circuit 24, from a residual signal, which is outputted from the first stage 10 and amplified by the second-first amplification circuit 21, or a residual signal, which is fed back from the output of the second stage 20 and amplified by the second-first amplification circuit 21. The second-first amplifier circuit 28 amplifies the residual signal resulting from the subtraction of the former from the latter, by a predetermined gain so as to output the amplified residual signal to the second stage 20. Here, the signal is amplified by a factor of 2 (2×) and is fed back to the input of the second stage 20.

In the second exemplary application, the second-first amplifier circuit 21 amplifies the sampled signal by 2× and therefore the signal outputted from the second D-A converter circuit 24 needs to be amplified by 2×, as well, on a path including the second sub-A-D converter circuit 22 and the second D-A converter 24. If the gain of the second-first amplifier circuit 21 is set to 1× (unity gain) and the gain of the second-second amplifier circuit 28 is set to 4×, the signal outputted from the second D-A converter 24 can be used without any modification thereto.

A first switch SW10 and a second switch SW20 are provided between the first stage 10 and the second stage 20. The first switch SW10 and the second switch SW20 turn on and off in a complementary manner.

With the first switch SW10 being ON and the second switch SW20 being OFF, the residual signal outputted from the first stage 10 is inputted to the second-first amplifier circuit 21 and the second sub-A-D converter circuit 22. On the other hand, with the first switch SW10 being OFF and the second switch SW20 being ON, the residual signal fed back from the output of the second stage 20 is inputted to the second-first amplifier circuit 21 and the second sub-A-D converter circuit 22.

It is to be noted here that a circuit block comprised of the first D-A converter circuit 14, the first subtraction circuit 16 and the first amplifier circuit 18 in combination may be configured by the use of the switched-capacitor circuit 300 according to any of the first embodiment to the third embodiment. Similarly, a circuit block comprised of the second D-A converter circuit 24, the second subtraction circuit 26 and the second-second amplifier circuit 28 in combination may be configured by the use of the switched-capacitor circuit 300 according to any of the first embodiment to the third embodiment.

Where the comparator-based amplifier circuit is used in the cyclic-type A-D converter 500b, use of the second exemplary application described as above reduces the effect of the offset component caused by the delay in the comparators, similarly to the pipeline-type A-D converter 500a. As a result, the analog-to-digital conversion can be achieved with high precision.

The present invention has been described based upon illustrative embodiments and their modifications. These embodiments are intended to be illustrative only and it will be obvious to those skilled in the art that various modifications to the combination of constituting elements and processes could be further developed and that such modifications are also within the scope of the present invention.

Figure 22:
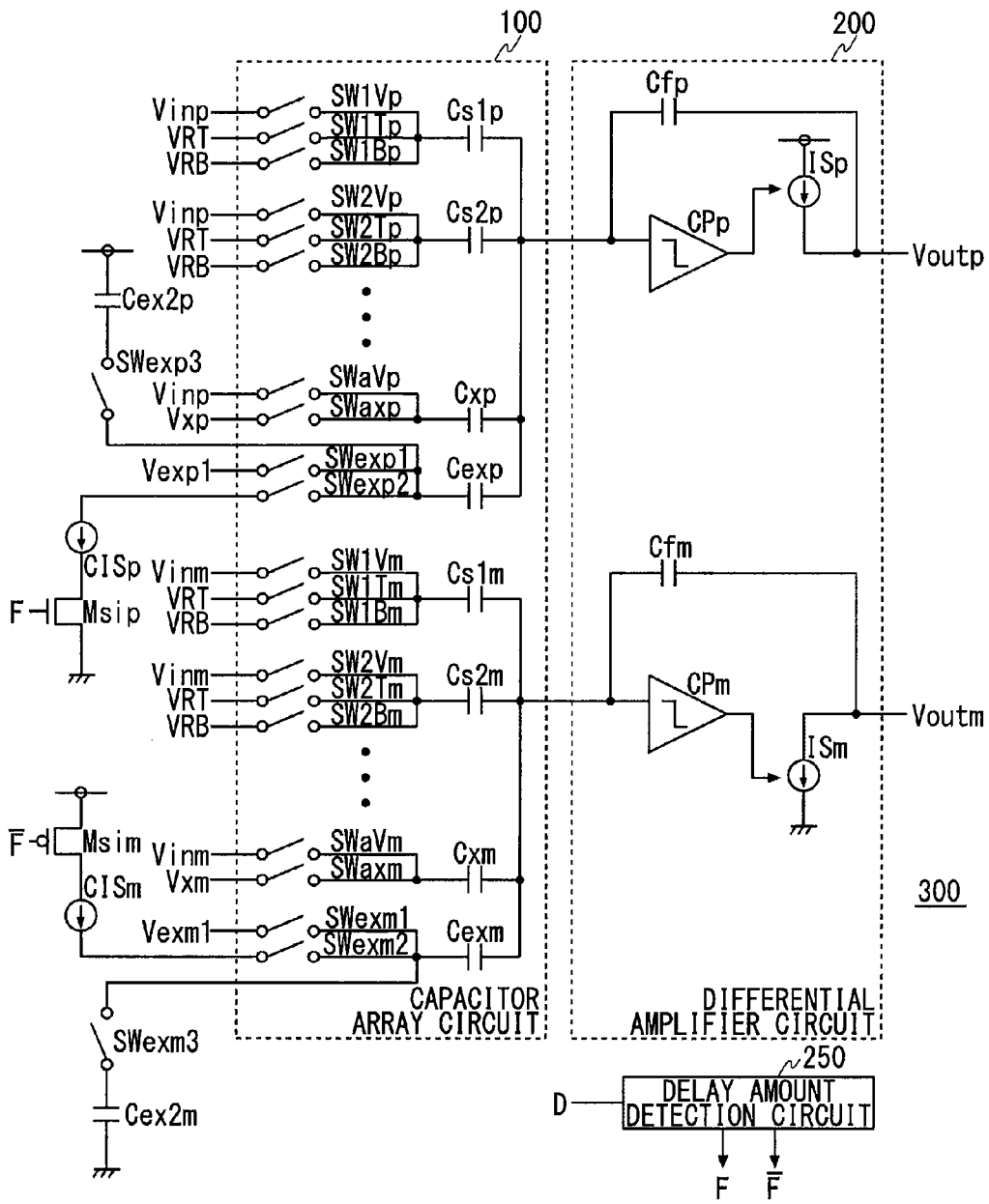
FIG. 22 is a configuration diagram of a switched-capacitor circuit according to a second modification of a second embodiment.

FIG. 22 is a configuration diagram of a switched-capacitor circuit 300 according to a second modification of the second embodiment. The switched-capacitor circuit 300 according to the second modification of the second embodiment is configured such that a positive-side stabilizing capacitor Cexp2, a positive-side stabilizing switch SWexp3, a negative-side stabilizing capacitor Cexm2 and a negative-side stabilizing switch SWexm3 are newly added to the switched-capacitor circuit 300 shown in FIG. 10.

One end of the positive-side stabilizing capacitor Cexp2 is connected to the node between the positive-side additional regulating capacitor Cexp and the positive-side first additional regulating voltage switch SWexp1 and the node between the positive-side additional regulating capacitor Cexp and the positive-side second additional regulating voltage switch SWexp2, via the positive-side stabilizing switch SWexp3. The other end of the positive-side stabilizing capacitor Cexp2 is connected to the first fixed voltage source (supply voltage here).

One end of the negative-side stabilizing capacitor Cexm2 is connected to the node between the negative-side additional regulating capacitor Cexm and the negative-side first additional regulating voltage switch SWexm1 and the node between the negative-side additional regulating capacitor Cexm and the negative-side second additional regulating voltage switch SWexm2, via the negative-side stabilizing switch SWexm3. The other end of the negative-side stabilizing capacitor Cexm2 is connected to the second fixed voltage source (ground voltage here).

In this switched capacitor circuit 300 according to the second modification of the second embodiment, the positive-side stabilizing switch SWexp3 and the negative-side stabilizing switch SWexm3 are turned on during amplification periods of the positive-side comparator CPp and the negative-side comparator CPm. Thereby, the inputs of the positive-side additional regulating capacitor Cexp and the negative-side additional regulating capacitor Cexm can be stabilized.

Note that the positive-side stabilizing capacitor Cexp2 and the negative-side stabilizing capacitor Cexm2 may be directly connected to the aforementioned nodes without provision of the positive-side stabilizing switch SWexp3 and the negative-side stabilizing switch SWexm3. Also, a positive-side voltage follower may be provided between the positive-side constant current source CISp and the positive-side second additional regulating voltage switch SWexp2. Similarly, a negative-side voltage follower may be provided between the negative-side constant current source CISm and the negative-side second additional regulating voltage switch SWexm2. Thereby, the inputs of the positive-side additional regulating capacitor Cexp and the negative-side additional regulating capacitor Cexm can be further stabilized.

Figure 23:
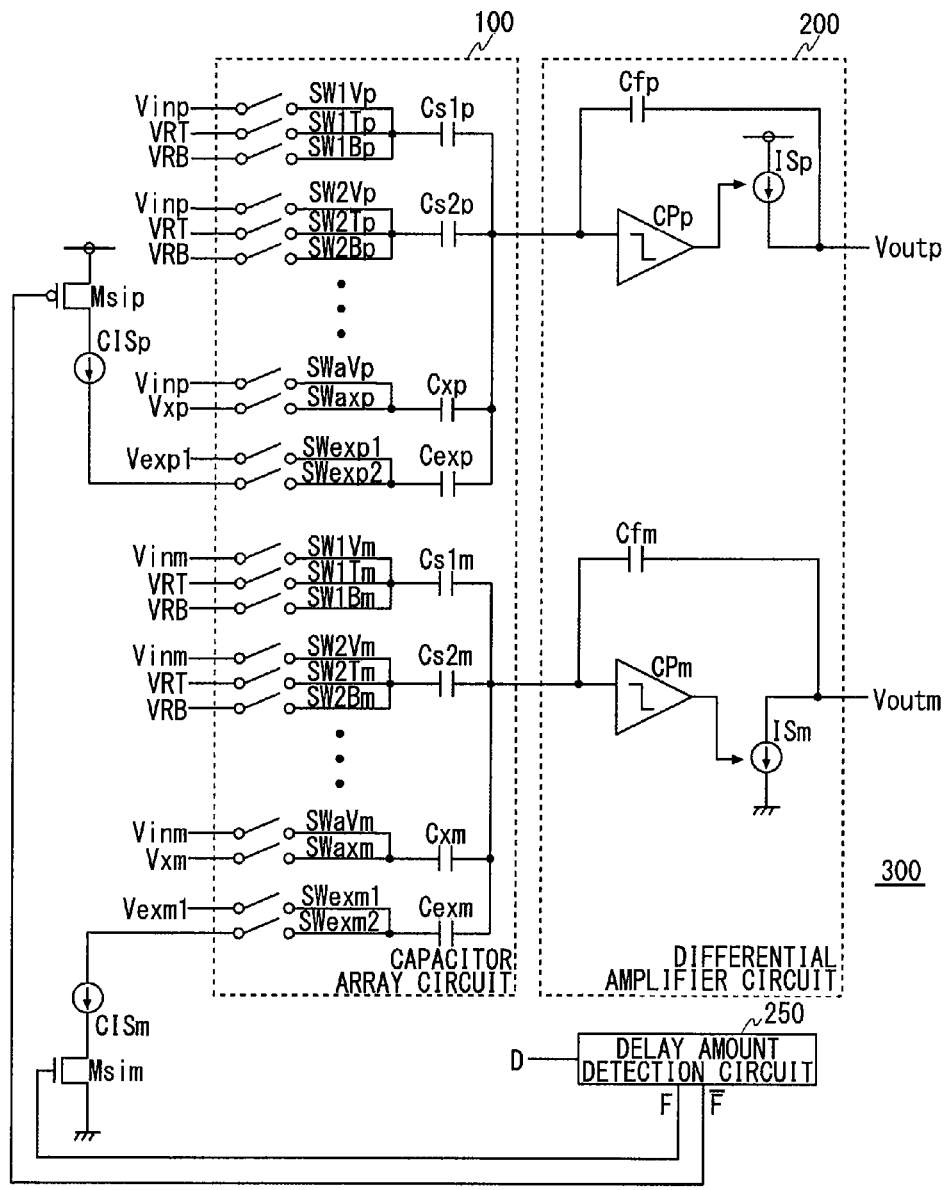
FIG. 23 is a configuration diagram of a switched-capacitor circuit according to a third modification of a second embodiment.

FIG. 23 is a configuration diagram of a switched-capacitor circuit 300 according to a third modification of the second embodiment. The configuration of the switched-capacitor circuit 300 according to the third modification of the second embodiment is basically the same as that of the switched-capacitor circuit 300 according to the first embodiment. Differences in the configuration will be described hereinbelow.

The positive-side additional regulating capacitor Cexp stores the electric charge used to compensate for an offset component attributable to the delay in the positive-side comparator CPp. The negative-side additional regulating capacitor Cexm stores the electric charge used to compensate for an offset component attributable to the delay in the negative-side comparator CPm.

In addition to the structural components of the switched-capacitor circuit 300 according to the first embodiment, the switched-capacitor circuit 300 according to the third modification of the second embodiment further includes a positive-side constant current source CISp, a positive-side constant current source switch Msip, a negative-side constant current source CISm, a negative-side constant current source switch Msim, and a delay amount detection circuit 250.

The positive-side constant current source CISp, which is connected to the input terminal of the positive-side additional regulating capacitor Cexp via the positive-side second additional regulating voltage switch SWexp2, supplies the constant current to the input terminal thereof. The negative-side constant current source CISm, which is connected to the input terminal of the negative-side additional regulating capacitor Cexm via the negative-side second additional regulating voltage switch SWexm2, pulls out the constant current from the input terminal thereof.

The positive-side constant current source switch Msip is provided between the first fixed voltage source (supply voltage here) and the positive-side constant current source CISp. The negative-side constant current source switch Msim is provided between the second fixed voltage source (ground voltage here) and the negative-side constant current source CISm.

The positive-side constant current source switch Msip is configured by a P-channel transistor. A source terminal of the P channel transistor is connected to the first fixed voltage source (supply voltage here). A drain terminal thereof is connected to the positive-side constant current source CISp. A gate terminal thereof receives an output signal (inverted signal F described later, which is the inverted signal of signal F) of the delay amount detection circuit 250.

The negative-side constant current source switch Msim is configured by an N-channel transistor. A source terminal of the N channel transistor is connected to the second fixed voltage source (ground voltage here). A drain terminal thereof is connected to the negative-side constant current source CISm. A gate terminal thereof receives an output signal (signal F described later) of the delay amount detection circuit 250.

The delay amount detection circuit 250 includes a dummy delay circuit 51 (see FIG. 11) for estimating the delay time of the positive-side comparator CPp and the negative-side comparator CPm. The delay amount detection circuit 250 is placed near the positive-side comparator CPp and the negative-side comparator CPm.

Figure 24:
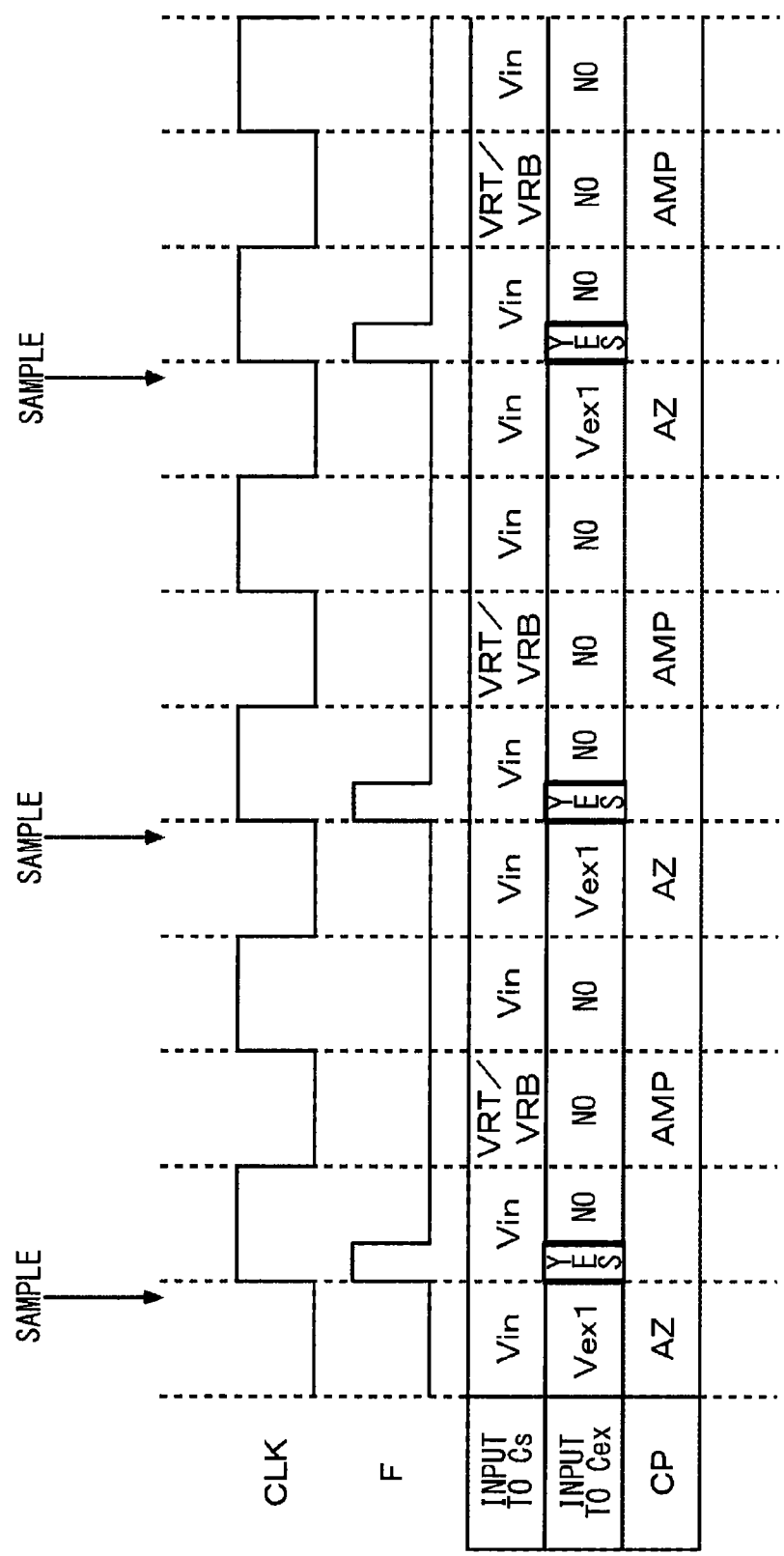
FIG. 24 is a timing chart showing an operation of a switched-capacitor circuit according to a third modification of a second embodiment.

FIG. 24 is a timing chart showing an operation of the switched-capacitor circuit 300 according to the third modification of the second embodiment. In the timing chart of FIG. 24 that differs from the timing charts of FIG. 3 and FIG. 6, an interval period is provided between an auto-zero period and an amplification period. Note that since the positive-side regulating capacitor Cxp and the negative-side regulating capacitor Cxm are given no attention in the third modification of the second embodiment and are therefore ignored here.

During auto-zero periods of the positive-side comparator CPp and the negative-side comparator CPm, the positive-side input analog signal Vinp is inputted to the positive-side input capacitors (Cs1p, Cs2p, ...); the negative-side input analog signal Vinm is inputted to the negative-side input capacitors (Cs1m, Cs2m, ...). Also, the positive-side first additional regulating voltage Vexp1 is inputted to the positive-side additional regulating capacitor Cexp, and the negative-side first additional regulating voltage Vexm1 is inputted to the negative-side additional regulating capacitor Cexm. Here, it is preferable that the positive-side first additional regulating voltage Vexp1 be set to a low voltage (e.g., ground voltage) in order that the positive-side constant current source CISp is easily operable in a saturated region. Also, it is preferable that the negative-side first additional regulating voltage Vexm1 be set to a high voltage (e.g., supply voltage) in order that the negative-side constant current source CISm is easily operable in a saturated region.

The positive-side input analog signal Vinp and the negative-side input analog signal Vinm at the end of the auto-zero periods become sampled values. In interval periods subsequent to the auto-zero periods, the sampled values are held in the positive-side input capacitors (Cs1p, Cs2p, ...) and the negative-side input capacitors (Cs1m, Cs2m, ...).

At the end of the auto-zero periods, the switches are so controlled that the positive-side first additional regulating voltage switch SWexp1 and the negative-side first additional regulating voltage switch SWexm1 are off and that the positive-side second additional regulating voltage switch SWexp2 and the negative-side second additional regulating voltage switch SWexm2 are on.

All the while the signal F is significant (goes high) in an interval period subsequent to the auto-zero periods, the positive-side constant current switch Msip and the negative-side constant current switch Msim are turned on. As the signal F transits to being nonsignificant (going low), the positive-side constant current source switch Msip and the negative-side constant current source switch Msim are turned off.

As a result, the input terminal of the positive-side additional regulating capacitor Cexp and the input terminal of the negative-side additional regulating capacitor Cexm can be set to a voltage corresponding to an offset component caused by the delay in the positive-side comparator CPp and the negative-side comparator CPm. The periods enclosed by a heavy line in FIG. 24 indicate period during which the electric charges are supplied to the input terminal of the positive-side additional regulating capacitor Cexp and the input terminal of the negative-side additional regulating capacitor Cexm from the positive-side constant current source CISp and the positive-side constant current source CISm, respectively.

In amplification periods of the positive-side comparator CPp and the negative-side comparator CPm, either the highpotential-side reference voltage VRT or low-potential-side reference voltage VRB is inputted to the positive-side input capacitors (Cs1p, Cs2p, . . . ) and the negative-side input capacitors (Cs1m, Cs2m, . . . ), respectively. Also, input terminal voltages set in the aforementioned interval periods are inputted to the positive-side additional regulating capacitor Cexp and the negative-side additional regulating capacitor Cexm, respectively.

During interval periods subsequent to the amplification periods, the positive-side input analog signal Vinp is inputted to the positive-side input capacitors (Cs1p, Cs2p, . . . ); the negative-side input analog signal Vinm is inputted to the negative-side input capacitors (Cs1m, Cs2m, . . . ). No signals is inputted to the positive-side additional regulating capacitor Cexp and the negative-side additional regulating capacitor Cexm.

By employing the third modification of the second embodiment described as above, the effect of the offset component attributable to the delay in the comparators can be reduced as well.

Also, in the second embodiment, a configuration without provision of the constant current source CIS and the constant current source switch Msi may be such that the delay amount detection circuit 250 calculates the second regulating voltage Vexp2 used to compensate for the offset voltage caused by the delay in the comparators CP and then inputs the thus calculated the second regulating voltage Vexp2 to the additional regulating capacitors Cex during the amplification periods of the comparator CP.

What is claimed is:

1. A switched-capacitor circuit, comprising:
a capacitor array circuit configured to receive a plurality of input signals, generate a single output signal by combining the plurality of input signals, and output the single output signal;
a comparator configured to receive the output signal of said capacitor array circuit; and
a current source, disposed between a first fixed voltage source and an output terminal of said switched-capacitor circuit, configured to supply a current to the output terminal thereof until an output signal of the comparator changes;
said capacitor array circuit including:
a plurality of input capacitors for receiving a plurality of input signals in parallel with each other; and
a regulating capacitor for storing a charge to compensate for an offset component caused by a delay in said comparator,
wherein the respective output terminals of the plurality of input capacitors and the regulating capacitor are combined into one, and
a current is supplied from a constant current source to the regulating capacitor for a length of time corresponding to the delay in said comparator.

2. A switched-capacitor circuit, comprising:
a capacitor array circuit configured to receive a plurality of input signals, generate a single output signal by combining the plurality of input signals, and output the single output signal;
a comparator configured to receive the output signal of said capacitor array circuit; and
a current source, disposed between a first fixed voltage source and an output terminal of said switched-capacitor circuit, configured to supply a current to the output terminal thereof until an output signal of the comparator changes;
said capacitor array circuit including:
a plurality of input capacitors for receiving a plurality of input signals in parallel with each other; and
a regulating capacitor for storing a charge to compensate for an offset component caused by a delay in said comparator,
wherein the respective output terminals of the plurality of input capacitors and the regulating capacitor are combined into one,
the switched capacitor circuit further comprising:
a constant current source connected to an input terminal of the regulating capacitor; and
a switch provided between a second fixed voltage source and said constant current source,
wherein, during an auto-zero period of said comparator, the input signals are inputted to the input terminals of the plurality of input capacitors, and a regulating voltage and a voltage based on the current supplied from said constant current source are sequentially inputted to the input terminal of the regulating capacitor,
wherein, during an amplification period of said comparator, a predetermined reference voltage is inputted to the input terminals of the input capacitors, and the regulating voltage is inputted to the input terminal of the regulating capacitor, and
wherein, during a part of the auto-zero period of the comparator, a current is supplied from said constant current source to the input terminal of the regulating capacitor, with the switch being turned on for a length of time corresponding to the delay of said comparator.

3. A switched-capacitor circuit according to claim 2, further comprising a delay amount detection circuit containing a dummy delay circuit for estimating delay time of said comparator,
wherein said delay amount detection circuit determines a length of time during which said switch is on, based on the delay time estimated by said dummy delay circuit.

4. A switched-capacitor circuit comprising:
a capacitor array circuit configured to receive a plurality of input signals, generate a single output signal by combining the plurality of input signals, and output the single output signal;
a comparator configured to receive the output signal of said capacitor array circuit; and
a current source, disposed between a first fixed voltage source and an output terminal of said switched-capacitor circuit, configured to supply a current to the output terminal thereof until an output signal of the comparator changes;
said capacitor array circuit including:
a plurality of input capacitors for receiving a plurality of input signals in parallel with each other; and
a regulating capacitor for storing a charge to compensate for an offset component caused by a delay in said comparator,
wherein said switched-capacitor circuit is of a differential configuration,
wherein said capacitor array circuit further includes another regulating capacitor configured to store a charge to compensate for a variance of an average voltage of a differential signal, and
wherein the respective output terminals of the plurality of input capacitors and the regulating capacitor and the another regulating capacitor are combined into one.

5. A switched-capacitor circuit comprising:
a capacitor array circuit configured to receive a plurality of input signals, generate a single output signal by combining the plurality of input signals, and output the single output signal;
a comparator configured to receive the output signal of said capacitor array circuit; and
a current source, disposed between a first fixed voltage source and an output terminal of said switched-capacitor circuit, configured to supply a current to the output terminal thereof until an output signal of the comparator changes;
said capacitor array circuit including:
a plurality of input capacitors for receiving a plurality of input signals in parallel with each other; and
a regulating capacitor for storing a charge to compensate for an offset component caused by a delay in said comparator,
the switched-capacitor circuit further comprising a feedback capacitor connected between the output terminal of said switched-capacitor circuit and the input terminal of said comparator,
wherein the plurality of input capacitors, the regulating capacitor and said feedback capacitor are arranged in a same semiconductor integrated circuit, and
wherein, in the semiconductor integrated circuit, a plurality of dummy capacitors are arranged so that the plurality of input capacitors, the regulating capacitor and said feedback capacitor receive substantially the same effect from capacitors surrounding a plurality of capacitors, respectively.

6. A switched-capacitor circuit comprising:
a capacitor array circuit configured to receive a plurality of input signals, generate a single output signal by combining the plurality of input signals, and output the single output signal;
a comparator configured to receive the output signal of said capacitor array circuit; and
a current source, disposed between a first fixed voltage source and an output terminal of said switched-capacitor circuit, configured to supply a current to the output terminal thereof until an output signal of the comparator changes;
said capacitor array circuit including:
a plurality of input capacitors for receiving a plurality of input signals in parallel with each other; and
a regulating capacitor for storing a charge to compensate for an offset component caused by a delay in said comparator,
the switched-capacitor circuit further comprising:
a constant current source;
a first switch provided between the first fixed voltage source and said constant current source;
a retention capacitor configured to receive a current supplied from said constant current source;
a second switch configured to input a regulating voltage to said retention capacitor;
a voltage follower configured to receive a voltage retained in said retention capacitor; and
a delay amount detection circuit containing a dummy delay circuit for estimating delay time of said comparator,
wherein said delay amount detection circuit determines a length of time during which said first switch is on, based on the delay time estimated by said dummy delay circuit.

7. A switched-capacitor circuit, comprising:
a capacitor array circuit configured to receive a plurality of input signals, generate a single output signal by combining the plurality of input signals, and output the single output signal;
a comparator configured to receive the output signal of said capacitor array circuit;
a first current source, disposed between the first fixed voltage source and the output terminal of said switched-capacitor circuit, configured to supply a current to the output terminal until an output signal of the comparator changes; and
a discharge switch, connected to the output terminal of said switched-capacitor circuit, configured to discharge a charge thereof;
a second current source connected between said discharge switch and a second fixed voltage source; and
a delay amount detection circuit containing a dummy delay circuit for estimating delay time of said comparator,
wherein said delay amount detection circuit determines a length of time during which said first switch is on, based on the delay time estimated by said dummy delay circuit.

8. An analog-to-digital (A-D) converter for converting input analog signals into digital signals from a higher-order bit toward a lower-order bit through a plurality of times of conversion processings, the A-D converter comprising:
a sub-A-D converter circuit configured to convert a first analog signal into a digital signal of a predetermined number of bits;
a digital-to-analog (D-A) converter circuit configured to convert the digital signal, which has been converted by said sub-A-D converter circuit, into a second analog signal;
a subtraction circuit configured to subtract the second analog signal from the first analog signal or the first analog signal amplified by a predetermined gain; and
an amplifier circuit configured to amplify a difference signal, between the first analog signal and the second analog signal, which is a result of subtraction done by said subtraction circuit, and generate an analog residual signal to be processed by a subsequent conversion processing,
wherein said D-A converter, said subtraction circuit and said amplifier circuit are configured by said switched-capacitor circuit according to claim 1.

* * * * *